(12) United States Patent
Owa et al.

(10) Patent No.: US 9,823,581 B2
(45) Date of Patent: Nov. 21, 2017

(54) EXPOSURE METHOD, SUBSTRATE STAGE, EXPOSURE APPARATUS, AND DEVICE MANUFACTURING METHOD

(71) Applicant: NIKON CORPORATION, Tokyo (JP)

(72) Inventors: Soichi Owa, Kumagaya (JP); Nobutaka Magome, Kumagaya (JP); Shigeru Hirukawa, Tokyo (JP); Yoshihiko Kudo, Tokyo (JP); Jiro Inoue, Kumagaya (JP); Hirotaka Kohno, Kumagaya (JP); Masahiro Nei, Yokohama (JP); Motokatsu Imai, Yokohama (JP); Hiroyuki Nagasaka, Kumagaya (JP); Kenichi Shiraishi, Saitama (JP); Yasufumi Nishii, Kumagaya (JP); Hiroaki Takaiwa, Kumagaya (JP)

(73) Assignee: NIKON CORPORATION, Tokyo (JP)

(*) Notice: Subject to any disclaimer, the term of this patent is extended or adjusted under 35 U.S.C. 154(b) by 0 days.

(21) Appl. No.: 14/696,898

(22) Filed: Apr. 27, 2015

(65) Prior Publication Data
US 2015/0301457 A1 Oct. 22, 2015

Related U.S. Application Data

(60) Division of application No. 13/753,969, filed on Jan. 30, 2013, now Pat. No. 9,019,467, which is a
(Continued)

(30) Foreign Application Priority Data

Jun. 13, 2003 (JP) ................................. 2003-169904
Nov. 13, 2003 (JP) ................................. 2003-383887
Feb. 17, 2004 (JP) ................................. 2004-039654

(51) Int. Cl.
*G03B 27/58* (2006.01)
*G03B 27/52* (2006.01)
*G03F 7/20* (2006.01)

(52) U.S. Cl.
CPC ......... *G03F 7/70341* (2013.01); *G03B 27/58* (2013.01); *G03F 7/2041* (2013.01); *G03F 7/707* (2013.01); *G03F 7/70716* (2013.01)

(58) Field of Classification Search
CPC .... G03F 7/2041; G03F 7/70341; G03F 7/707; G03F 7/70716; G03F 7/70725;
(Continued)

(56) References Cited

U.S. PATENT DOCUMENTS 4,346,164 A 8/1982 Tabarelli et al.
4,465,368 A 8/1984 Matsuura et al.
(Continued)

FOREIGN PATENT DOCUMENTS

CN 1501175 A 6/2004
DE 221563 A1 4/1985
(Continued)

OTHER PUBLICATIONS

English translation of JP10-303114, published on Nov. 13, 1998.*
(Continued)

*Primary Examiner* — Christina Riddle
(74) *Attorney, Agent, or Firm* — Oliff PLC

(57) ABSTRACT

An exposure apparatus exposes a substrate by projecting a pattern image onto the substrate through a liquid. The exposure apparatus includes a projection optical system by which the pattern image is projected onto the substrate, and a movable member which is movable relative to the projection optical system. A liquid-repellent member, at least a part of a surface of which is liquid-repellent, is provided detach-
(Continued)

ably on the movable member, the liquid-repellent member being different from the substrate.

17 Claims, 21 Drawing Sheets

Related U.S. Application Data continuation of application No. 12/232,064, filed on Sep. 10, 2008, now Pat. No. 8,384,880, which is a division of application No. 11/297,324, filed on Dec. 9, 2005, now Pat. No. 7,483,119, which is a continuation of application No. PCT/JP2004/008578, filed on Jun. 11, 2004.

(58) Field of Classification Search
CPC .............. G03F 7/70775; G03F 7/7085; G03F 7/70858; G03F 7/70866; G03F 7/70908; G03B 27/58
USPC ................... 355/30, 52, 50, 53, 55, 67–77; 250/492.1, 492.2, 492.22, 548; 430/8, 30, 430/311
See application file for complete search history.

(56) References Cited

U.S. PATENT DOCUMENTS

| | | | |
|---|---|---|---|
| 4,480,910 A | 11/1984 | Takanashi et al. |
| 5,284,802 A | 2/1994 | Muraoka et al. |
| 5,493,403 A | 2/1996 | Nishi |
| 5,528,118 A | 6/1996 | Lee |
| 5,591,958 A | 1/1997 | Nishi et al. |
| 5,610,683 A | 3/1997 | Takahashi |
| 5,623,853 A | 4/1997 | Novak et al. |
| 5,633,698 A | 5/1997 | Imai |
| 5,646,413 A | 7/1997 | Nishi |
| 5,715,039 A | 2/1998 | Fukuda et al. |
| 5,728,495 A | 3/1998 | Ozawa |
| 5,825,043 A | 10/1998 | Suwa |
| 5,874,820 A | 2/1999 | Lee |
| 5,923,408 A | 7/1999 | Takabayashi |
| 5,969,441 A | 10/1999 | Loopstra et al. |
| 6,191,429 B1 | 2/2001 | Suwa |
| 6,195,154 B1 | 2/2001 | Imai |
| 6,208,407 B1 | 3/2001 | Loopstra |
| 6,341,007 B1 | 1/2002 | Nishi et al. |
| 6,381,013 B1 | 4/2002 | Richardson |
| 6,400,441 B1 | 6/2002 | Nishi et al. |
| 6,549,269 B1 | 4/2003 | Nishi et al. |
| 6,590,634 B1 | 7/2003 | Nishi et al. |
| 6,650,399 B2 | 11/2003 | Baselmans et al. |
| 6,809,794 B1 | 10/2004 | Sewell |
| 6,819,414 B1 | 11/2004 | Takeuchi |
| 6,828,542 B2 | 12/2004 | Ye et al. |
| 6,882,406 B2 | 4/2005 | Kurt et al. |
| 6,940,582 B1 | 9/2005 | Tanaka |
| 7,199,858 B2 | 4/2007 | Lof et al. |
| 7,483,119 B2 | 1/2009 | Owa et al. |
| 7,760,366 B2 | 7/2010 | Mengel et al. |
| 7,796,274 B2 | 9/2010 | Mengel et al. |
| 8,368,870 B2 | 2/2013 | Shibuta |
| 2001/0026355 A1 | 10/2001 | Aoki et al. |
| 2002/0041377 A1 | 4/2002 | Hagiwara et al. |
| 2002/0061469 A1 | 5/2002 | Tanaka |
| 2002/0074635 A1 | 6/2002 | Hattori et al. |
| 2002/0163629 A1 | 11/2002 | Switkes et al. |
| 2003/0030916 A1 | 2/2003 | Suenaga |
| 2003/0066975 A1 | 4/2003 | Okada |
| 2003/0108806 A1 | 6/2003 | Chen |
| 2003/0139620 A1 | 7/2003 | Yamaguchi et al. |
| 2003/0174408 A1 | 9/2003 | Rostalski et al. |
| 2003/0226951 A1 | 12/2003 | Ye et al. |
| 2004/0000627 A1 | 1/2004 | Schuster |
| 2004/0060195 A1 | 4/2004 | Garcia et al. |
| 2004/0075895 A1 | 4/2004 | Lin |
| 2004/0109237 A1 | 6/2004 | Epple et al. |
| 2004/0114117 A1 | 6/2004 | Bleeker |
| 2004/0118184 A1 | 6/2004 | Violette |
| 2004/0119954 A1 | 6/2004 | Kawashima et al. |
| 2004/0125351 A1 | 7/2004 | Krautschik |
| 2004/0136494 A1* | 7/2004 | Lof ..................... G03F 7/70341 378/34 |
| 2004/0160582 A1* | 8/2004 | Lof ..................... G03F 7/70341 355/30 |
| 2004/0165159 A1 | 8/2004 | Lof et al. |
| 2004/0169834 A1 | 9/2004 | Richter et al. |
| 2004/0169924 A1 | 9/2004 | Flagello et al. |
| 2004/0180294 A1 | 9/2004 | Baba-Ali et al. |
| 2004/0180299 A1 | 9/2004 | Rolland et al. |
| 2004/0207824 A1 | 10/2004 | Lof et al. |
| 2004/0211920 A1 | 10/2004 | Maria Derksen et al. |
| 2004/0224265 A1 | 11/2004 | Endo et al. |
| 2004/0224525 A1 | 11/2004 | Endo et al. |
| 2004/0227923 A1 | 11/2004 | Flagello et al. |
| 2004/0233405 A1 | 11/2004 | Kato et al. |
| 2004/0253547 A1 | 12/2004 | Endo et al. |
| 2004/0253548 A1 | 12/2004 | Endo et al. |
| 2004/0257544 A1 | 12/2004 | Vogel et al. |
| 2004/0259008 A1 | 12/2004 | Endo et al. |
| 2004/0259040 A1 | 12/2004 | Endo et al. |
| 2004/0263808 A1 | 12/2004 | Sewell |
| 2004/0263809 A1 | 12/2004 | Nakano |
| 2005/0000941 A1 | 1/2005 | Ward |
| 2005/0002004 A1 | 1/2005 | Kolesnychenko et al. |
| 2005/0007569 A1 | 1/2005 | Streefkerk et al. |
| 2005/0007570 A1 | 1/2005 | Streefkerk et al. |
| 2005/0018155 A1 | 1/2005 | Cox et al. |
| 2005/0018156 A1 | 1/2005 | Mulkens et al. |
| 2005/0024609 A1 | 2/2005 | De Smit et al. |
| 2005/0030497 A1 | 2/2005 | Nakamura |
| 2005/0030498 A1 | 2/2005 | Mulkens |
| 2005/0030506 A1 | 2/2005 | Schuster |
| 2005/0030511 A1 | 2/2005 | Auer-Jongepier et al. |
| 2005/0036121 A1 | 2/2005 | Hoogendam et al. |
| 2005/0036183 A1 | 2/2005 | Yeo et al. |
| 2005/0036184 A1 | 2/2005 | Yeo et al. |
| 2005/0036213 A1 | 2/2005 | Mann et al. |
| 2005/0037269 A1 | 2/2005 | Levinson |
| 2005/0041225 A1 | 2/2005 | Sengers et al. |
| 2005/0042554 A1 | 2/2005 | Dierichs et al. |
| 2005/0046813 A1 | 3/2005 | Streefkerk et al. |
| 2005/0046934 A1 | 3/2005 | Ho et al. |
| 2005/0048220 A1 | 3/2005 | Mertens et al. |
| 2005/0048223 A1 | 3/2005 | Pawloski et al. |
| 2005/0052632 A1 | 3/2005 | Miyajima |
| 2005/0068639 A1 | 3/2005 | Pierrat et al. |
| 2005/0073670 A1 | 4/2005 | Carroll |
| 2005/0074704 A1 | 4/2005 | Endo et al. |
| 2005/0078286 A1 | 4/2005 | Dierichs et al. |
| 2005/0078287 A1 | 4/2005 | Sengers et al. |
| 2005/0084794 A1 | 4/2005 | Meagley et al. |
| 2005/0088635 A1 | 4/2005 | Hoogendam et al. |
| 2005/0094114 A1 | 5/2005 | Streefkerk et al. |
| 2005/0094116 A1 | 5/2005 | Flagello et al. |
| 2005/0094119 A1 | 5/2005 | Loopstra et al. |
| 2005/0100745 A1 | 5/2005 | Lin et al. |
| 2005/0106512 A1 | 5/2005 | Endo et al. |
| 2005/0110973 A1 | 5/2005 | Streefkerk et al. |
| 2005/0117135 A1 | 6/2005 | Verhoeven et al. |
| 2005/0117224 A1 | 6/2005 | Shafer et al. |
| 2005/0122497 A1 | 6/2005 | Lyons et al. |
| 2005/0122505 A1 | 6/2005 | Miyajima |
| 2005/0128445 A1 | 6/2005 | Hoogendam et al. |
| 2005/0132914 A1 | 6/2005 | Mulkens et al. |
| 2005/0134815 A1 | 6/2005 | Van Santen et al. |
| 2005/0134817 A1 | 6/2005 | Nakamura |
| 2005/0136361 A1 | 6/2005 | Endo et al. |
| 2005/0141098 A1 | 6/2005 | Schuster |
| 2005/0145265 A1 | 7/2005 | Ravkin et al. |
| 2005/0145803 A1 | 7/2005 | Hakey et al. |
| 2005/0146693 A1 | 7/2005 | Ohsaki |
| 2005/0146694 A1 | 7/2005 | Tokita |

(56) References Cited

U.S. PATENT DOCUMENTS

| | | |
|---|---|---|
| 2005/0146695 A1 | 7/2005 | Kawakami |
| 2005/0147920 A1 | 7/2005 | Lin et al. |
| 2005/0153424 A1 | 7/2005 | Coon |
| 2005/0158673 A1 | 7/2005 | Hakey et al. |
| 2005/0164502 A1 | 7/2005 | Deng et al. |
| 2005/0174549 A1 | 8/2005 | Duineveld et al. |
| 2005/0174550 A1 | 8/2005 | Streefkerk et al. |
| 2005/0175776 A1 | 8/2005 | Streefkerk et al. |
| 2005/0175940 A1 | 8/2005 | Dierichs |
| 2005/0179877 A1 | 8/2005 | Mulkens et al. |
| 2005/0185269 A1 | 8/2005 | Epple et al. |
| 2005/0190435 A1 | 9/2005 | Shafer et al. |
| 2005/0190455 A1 | 9/2005 | Rostalski et al. |
| 2005/0205108 A1 | 9/2005 | Chang et al. |
| 2005/0213061 A1 | 9/2005 | Hakey et al. |
| 2005/0213072 A1 | 9/2005 | Schenker et al. |
| 2005/0217135 A1 | 10/2005 | O'Donnell et al. |
| 2005/0217137 A1 | 10/2005 | Smith et al. |
| 2005/0217703 A1 | 10/2005 | O'Donnell |
| 2005/0219481 A1 | 10/2005 | Cox et al. |
| 2005/0219482 A1 | 10/2005 | Baselmans et al. |
| 2005/0219488 A1 | 10/2005 | Nei et al. |
| 2005/0219499 A1 | 10/2005 | Maria Zaal et al. |
| 2005/0225737 A1 | 10/2005 | Weissenrieder et al. |
| 2005/0231694 A1 | 10/2005 | Kolesnychenko et al. |
| 2005/0233081 A1 | 10/2005 | Tokita |
| 2005/0237501 A1 | 10/2005 | Furukawa et al. |
| 2005/0237504 A1 | 10/2005 | Nagasaka et al. |
| 2005/0243292 A1 | 11/2005 | Baselmans et al. |
| 2005/0245005 A1 | 11/2005 | Benson |
| 2005/0253090 A1 | 11/2005 | Gau et al. |
| 2005/0259232 A1 | 11/2005 | Streefkerk et al. |
| 2005/0259233 A1 | 11/2005 | Streefkerk et al. |
| 2005/0259234 A1 | 11/2005 | Hirukawa et al. |
| 2005/0259236 A1 | 11/2005 | Straaijer |
| 2005/0263068 A1 | 12/2005 | Hoogendam et al. |
| 2005/0264778 A1 | 12/2005 | Lof et al. |
| 2005/0270505 A1 | 12/2005 | Smith |
| 2006/0103830 A1 | 5/2006 | Holmes et al. |
| 2006/0103832 A1 | 5/2006 | Hazelton et al. |
| 2006/0139614 A1 | 6/2006 | Owa et al. |
| 2006/0141400 A1 | 6/2006 | Hirayama et al. |
| 2006/0192930 A1 | 8/2006 | Iimura et al. |
| 2007/0109521 A1 | 5/2007 | Nishii et al. |
| 2007/0177119 A1 | 8/2007 | Chiba |
| 2007/0177125 A1 | 8/2007 | Shibazaki |
| 2007/0269294 A1 | 11/2007 | Nagasaka et al. |
| 2008/0246931 A1 | 10/2008 | Nakano et al. |

FOREIGN PATENT DOCUMENTS

| | | | |
|---|---|---|---|
| DE | 224 448 A1 | | 7/1985 |
| EP | 0 605 103 A1 | | 7/1994 |
| EP | 1 079 223 A1 | | 2/2001 |
| EP | 1429188 A2 | | 6/2004 |
| EP | 1571698 A1 | | 9/2005 |
| EP | 1 628 329 A1 | | 2/2006 |
| EP | 1 641 028 A1 | | 3/2006 |
| EP | 1670043 A2 | | 6/2006 |
| JP | S57-153433 A | | 9/1982 |
| JP | S58-202448 A | | 11/1983 |
| JP | S59-19912 A | | 2/1984 |
| JP | S62-65326 A | | 3/1987 |
| JP | S62-221130 A | | 9/1987 |
| JP | S63-157419 A | | 6/1988 |
| JP | H04-65603 A | | 3/1992 |
| JP | H04-305915 A | | 10/1992 |
| JP | H04-305917 A | | 10/1992 |
| JP | H05-62877 A | | 3/1993 |
| JP | H06-53120 A | | 2/1994 |
| JP | H06-124873 A | | 5/1994 |
| JP | H06-188169 A | | 7/1994 |
| JP | H06-326174 A | | 11/1994 |
| JP | 07-81978 A | | 3/1995 |
| JP | H07-78750 A | | 3/1995 |
| JP | H07-176468 A | | 4/1995 |
| JP | H07-220990 A | | 8/1995 |
| JP | H08-37149 A | | 2/1996 |
| JP | H08-166475 A | | 6/1996 |
| JP | H08-279549 A | | 10/1996 |
| JP | H08-316125 A | | 11/1996 |
| JP | H08-330224 A | | 12/1996 |
| JP | H09-36212 A | | 2/1997 |
| JP | H10-163099 A | | 6/1998 |
| JP | H10-214783 A | | 8/1998 |
| JP | H10-255319 A | | 9/1998 |
| JP | H10-303114 A | | 11/1998 |
| JP | H10-340846 A | | 12/1998 |
| JP | H11-16816 A | | 1/1999 |
| JP | H11-111819 A | | 4/1999 |
| JP | H11-135400 A | | 5/1999 |
| JP | H11-163103 A | | 6/1999 |
| JP | H11-176727 A | | 7/1999 |
| JP | 11239758 A | * | 9/1999 |
| JP | H11-239758 A | | 9/1999 |
| JP | 2000-058436 A | | 2/2000 |
| JP | 2000-505958 A | | 5/2000 |
| JP | 2002-014005 A | | 1/2002 |
| JP | 2003-238577 A | | 8/2003 |
| JP | 2003-240906 A | | 8/2003 |
| JP | S57-117238 A | | 9/2003 |
| JP | 2004-207711 A | | 7/2004 |
| JP | 2004-289127 A | | 10/2004 |
| JP | 2005-005707 A | | 1/2005 |
| JP | 2005-019864 A | | 1/2005 |
| TW | 521320 B | | 2/2003 |
| TW | 522460 B | | 3/2003 |
| TW | 200424730 A | | 11/2004 |
| TW | 200424790 A | | 11/2004 |
| WO | 98/24115 A1 | | 6/1998 |
| WO | 98/28665 A1 | | 7/1998 |
| WO | 99/49504 A1 | | 9/1999 |
| WO | 99/60361 A1 | | 11/1999 |
| WO | 01/22480 A1 | | 3/2001 |
| WO | 02/091078 A1 | | 11/2002 |
| WO | 03/077036 A1 | | 9/2003 |
| WO | 03/077037 A1 | | 9/2003 |
| WO | 2004/019128 A2 | | 3/2004 |
| WO | 2004/053953 A1 | | 6/2004 |
| WO | 2004/053955 A1 | | 6/2004 |
| WO | 2004/053956 A1 | | 6/2004 |
| WO | 2004/055803 A1 | | 7/2004 |
| WO | 2004/057589 A1 | | 7/2004 |
| WO | 2004/057590 A1 | | 7/2004 |
| WO | 2004/077154 A2 | | 9/2004 |
| WO | 2004/081666 A1 | | 9/2004 |
| WO | 2004/090577 A2 | | 10/2004 |
| WO | 2004/090633 A2 | | 10/2004 |
| WO | 2004/090634 A2 | | 10/2004 |
| WO | 2004/092830 A2 | | 10/2004 |
| WO | 2004/092833 A2 | | 10/2004 |
| WO | 2004/093130 A2 | | 10/2004 |
| WO | 2004/093159 A2 | | 10/2004 |
| WO | 2004/093160 A2 | | 10/2004 |
| WO | 2004/095135 A2 | | 11/2004 |
| WO | 2005/001432 A2 | | 1/2005 |
| WO | 2005/001572 A2 | | 1/2005 |
| WO | 2005/003864 A2 | | 1/2005 |
| WO | 2005/006026 A2 | | 1/2005 |
| WO | 2005/008339 A2 | | 1/2005 |
| WO | 2005/013008 A2 | | 2/2005 |
| WO | 2005/015283 A1 | | 2/2005 |
| WO | 2005/017625 A2 | | 2/2005 |
| WO | 2005/019935 A2 | | 3/2005 |
| WO | 2005/022266 A2 | | 3/2005 |
| WO | 2005/024325 A2 | | 3/2005 |
| WO | 2005/024517 A2 | | 3/2005 |
| WO | 2005/034174 A2 | | 4/2005 |
| WO | 2005/048328 A1 | | 5/2005 |
| WO | 2005/050324 A2 | | 6/2005 |
| WO | 2005/054953 A2 | | 6/2005 |
| WO | 2005/054955 A2 | | 6/2005 |
| WO | 2005/059617 A2 | | 6/2005 |
| WO | 2005/059618 A2 | | 6/2005 |

(56) References Cited

FOREIGN PATENT DOCUMENTS

| WO | 2005/059645 A2 | 6/2005 |
|---|---|---|
| WO | 2005/059654 A1 | 6/2005 |
| WO | 2005/062128 A2 | 7/2005 |
| WO | 2005/062351 A1 | 7/2005 |
| WO | 2005/064400 A2 | 7/2005 |
| WO | 2005/064405 A2 | 7/2005 |
| WO | 2005/069055 A2 | 7/2005 |
| WO | 2005/069078 A1 | 7/2005 |
| WO | 2005/069081 A2 | 7/2005 |
| WO | 2005/071491 A2 | 8/2005 |
| WO | 2005/074606 A2 | 8/2005 |
| WO | 2005/076084 A1 | 8/2005 |
| WO | 2005/081030 A1 | 9/2005 |
| WO | 2005/081067 A1 | 9/2005 |
| WO | 2005/098504 A1 | 10/2005 |
| WO | 2005/098505 A1 | 10/2005 |
| WO | 2005/098506 A1 | 10/2005 |
| WO | 2005/106589 A1 | 11/2005 |
| WO | 2005/111689 A2 | 11/2005 |
| WO | 2005/111722 A2 | 11/2005 |
| WO | 2005/119368 A2 | 12/2005 |
| WO | 2005/119369 A1 | 12/2005 |

OTHER PUBLICATIONS

English translation of DD 221563, published on Apr. 24, 1985.*
Jul. 20, 2010 Office Action in U.S. Appl. No. 12/007,450.
Feb. 16, 2012 First Examination Report in Chinese Patent Application No. 201110089902.03.
Jul. 12, 2011 Office Action issued in U.S. Appl. No. 12/232,064.
Mar. 22, 2012 Office Action issued in U.S. Appl. No. 12/232,064.
Oct. 23, 2012 Notice of Allowance issued in U.S. Appl. No. 12/232,064.
Jan. 27, 2015 Office Action issued in Japanese Application No. 2014-044468.
Mar. 9, 2007 Office Action in U.S. Appl. No. 11/297,324.
Dec. 5, 2007 Notice of Allowance in U.S. Appl. No. 11/297,324.
Jun. 9, 2008 Notice of Allowance in U.S. Appl. No. 11/297,324.
Jul. 12, 2007 Office Action in U.S. Appl. No. 11/448,927.
Nov. 23, 2009 Office Action in U.S. Appl. No. 10/581,307.
Aug. 27, 2010 Office Action in U.S. Appl. No. 10/581,307.
Dec. 8, 2010 Office Action in U.S. Appl. No. 11/639,245.
Nov. 9, 2004 International Search Report in International Application No. PCT/JP2004/008578.
Sep. 15, 2008 Supplemental European Search Report in European Application No. 04746086.0.
Mar. 29, 2005 International Search Report in International Application No. PCT/JP2004/018435.
Sep. 15, 2008 Supplemental European Search Report in European Application No. 04801655.4.
Nov. 9, 2004 Written Opinion in International Application No. PCT/JP2004/008578.
Mar. 29, 2005 Written Opinion in International Application No. PCT/JP2004/018435.
Jan. 5, 2010 Office Action in Japanese Application No. 2004-349940.
Apr. 20, 2010 Notice of Allowance in Japanese Application No. 2004-349940.
Dec. 22, 2009 Office Action in Japanese Application No. 2005-028724.
Apr. 20, 2010 Notice of Allowance in Japanese Application No. 2005-028724.
Aug. 4, 2009 Office Action in Japanese Application No. 2005-507005.
Nov. 4, 2009 Notice of Allowance in Japanese Application No. 2005-507005.
Aug. 2, 2007 Australian Written Opinion in Singapore Application No. 200603679-2.
May 22, 2008 Australian Office Action in Singapore Application No. 200603679-2.

Jan. 4, 2008 Office Action in Chinese Application No. 200480035901.9.
Aug. 28, 2009 Office Action in Chinese Application No. 200480035901.9.
Oct. 19, 2009 Office Action in Israeli Application No. 176057.
Oct. 4, 2010 Office Action in Israeli Application No. 176057.
B.J. Lin; "Semiconductor Foundry, Lithography, and Partners"; Plenary Paper; Emerging Lithographic Technologies VI; Proceedings of SPIE; vol. 4688; 2002; pp. 11-24.
M. Switkes et al.; "Resolution Enhancement of 157 nm Lithography by Liquid Immersion"; Optical Microlithography XV; Proceedings of SPIE; vol. 4691; 2002; pp. 459-465.
M. Switkes et al.; "Resolution Enhancement of 157 nm Lithography by Liquid Immersion"; Journal of Microlith., Microfab., Microsyst.; vol. 1, No. 3; Oct. 2002; pp. 1-4.
Soichi Owa et al.; "Nikon F2 Exposure Tool"; Nikon Corporation; 3rd 157 nm Symposium; Sep. 4, 2002; 25 pg slides (slides 1-25).
Soichi Owa; "Immersion Lithography"; Nikon Corporation; Immersion Lithography Workshop; Dec. 11, 2002; 24pg slides (slides 1-24).
Soichi Owa et al.; "Immersion Lithography; Its Potential Performance and Issues"; Optical Microlithography XVI; Proceedings of SPIE; vol. 5040; 2003; pp. 724-733.
Soichi Owa et al.; "Potential Performance and Feasibility of Immersion Lithography"; Nikon Corporation; NGL Workshop; Jul. 10, 2003; 33 pg slides (slides 1-33).
S. Owa et al.; "Update on 193nm Immersion Exposure Tool"; Nikon Corporation; Immersion Workshop; Jan. 27, 2004; 38 pg slides (slides 1-38).
S. Owa et al.; "Update on 193nm Immersion Exposure Tool"; Nikon Corporation; Litho Forum; Jan. 28, 2004; 51 pg slides (slides 1-51).
Dec. 27, 2011 Office Action in Korean Patent Application No. 2011-7024388.
Mar. 1, 2011 Notice of Allowance in U.S. Appl. No. 10/581,307.
Oct. 23, 2009 Office Action in U.S. Appl. No. 12/007,450.
Feb. 21, 2011 Office Action in Taiwanese Application No. 093116810.
Feb. 28, 2011 Office Action in Korean Application No. 2005-7023920.
Mar. 9, 2011 Office Action in Israeli Application No. 207788.
Mar. 9, 2011 Office Action in Israeli Application No. 207790.
Apr. 15, 2011 Office Action in Korean Application No. 2006-7005879.
Jun. 6, 2011 Office Action issued in U.S. Appl. No. 12/232,063.
Jun. 13, 2011 Notice of Allowance in U.S. Appl. No. 12/007,450.
Sep. 1, 2011 Office Action in U.S. Appl. No. 11/639,245.
Jul. 3, 2012 Office Action issued in Japanese Patent Application No. 2010-050828.
Jul. 3, 2012 Office Action issued in Japanese Patent Application No. 2009-231860.
Sep. 28, 2012 Office Action issued in Taiwanese Patent Application No. 098124811.
Sep. 28, 2012 Office Action issued in Taiwanese Patent Application No. 100137115.
Jan. 5, 2016 Office Action issued in Japanese Patent Application No. 2015-070170.
Dec. 3, 2013 Office Action issued in Japanese Patent Application No. 2012-083220.
Dec. 5, 2013 Office Action issued in U.S. Appl. No. 11/639,245.
Jul. 30, 2014 Office Action issued in Korean Patent Application No. 2012-7025739.
Aug. 1, 2014 Office Action issued in European Patent Application No. 14150747.5.
Jun. 27, 2014 Office Action issued in Korean Patent Application No. 2013-7020081.
Jan. 7, 2014 Office Action issued in Japanese Patent Application No. 2012-193619.
Jan. 7, 2014 Office Action issued in Japanese Patent Application No. 2012-193620.
Feb. 14, 2014 Office Action issued in Taiwanese Patent Application No. 098124811.
Jun. 2, 2014 Office Action issued in U.S. Appl. No. 13/754,112.
Jun. 11, 2014 Office Action issued in U.S. Appl. No. 11/639,245.

(56) References Cited

OTHER PUBLICATIONS

Jun. 20, 2014 Office Action issued in European Patent Application No. 04 746 086.0.
May 21, 2013 Office Action issued in Taiwanese Patent Application No. 098124811.
Mar. 25, 2013 Office Action issued in European Patent Application No. 04746086.0.
Mar. 19, 2013 Office Action issued in U.S. Appl. No. 11/639,245.
Jul. 19, 2013 Office Action issued in U.S. Appl. No. 13/754,112.
Aug. 13, 2013 Office Action issued in European Patent Application No. 04 801 655.4.
May 23, 2013 Office Action issued in U.S. Appl. No. 13/753,969.
Feb. 4, 2014 Office Action issued in U.S. Appl. No. 13/753,969.
Feb. 5, 2015 Notice of Allowance issued in U.S. Appl. No. 13/753,969.
Aug. 27, 2015 Office Action issued in European Application No. 04801655.4.
Aug. 7, 2015 Office Action issued in Taiwanese Application No. 103128271.
Mar. 21, 2016 Office Action issued in Korean Patent Application No. 10-2015-7002702.
Aug. 12, 2016 Office Action issued in U.S. Appl. No. 14/697,374.
Jul. 26, 2016 Office Action issued in Korean Application No. 10-2015-7019719.
Sep. 13, 2016 Office Action issued in Japanese Application No. 2015-070170.
Feb. 14, 2017 Office Action issued in Taiwanese Patent Application No. 105105425.
Mar. 30, 2017 Office Action issued in U.S. Appl. No. 14/697,374.
Jan. 31, 2017 Office Action issued in Japanese Patent Application No. 2016-043921.
May 18, 2017 Office Action issued in Korean Application No. 10-2015-7019719.
Jun. 13, 2017 Office Action issued in Taiwan Patent Application No. 105128062.
Sep. 21, 2017 Advisory Action issued in U.S. Appl. No. 14/697,374.
Sep. 22, 2017 Office Action issued in Korean Application No. 10-2016-7026062.

\* cited by examiner

EXPOSURE METHOD, SUBSTRATE STAGE, EXPOSURE APPARATUS, AND DEVICE MANUFACTURING METHOD

CROSS-REFERENCE TO RELATED APPLICATION

This is a division of U.S. patent application Ser. No. 13/753,969, filed Jan. 30, 2013, which is a continuation of U.S. patent application Ser. No. 12/232,064, filed Sep. 10, 2008, which is a division of U.S. patent application Ser. No. 11/297,324 filed Dec. 9, 2005, which in turn is a Continuation of International Application No. PCT/JP2004/008578, filed Jun. 11, 2004, which claims priority to Japanese Patent Application Nos. 2003-169904 (filed on Jun. 13, 2003), 2003-383887 (filed on Nov. 13, 2003), and 2004-039654 (filed on Feb. 17, 2004). The disclosures of the aforementioned applications are incorporated herein by reference in their entireties.

BACKGROUND OF THE INVENTION

Field of the Invention

The present invention relates to an exposure method by which a pattern image is exposed, via a projection optical system and a liquid, on a substrate; to a substrate stage that supports a substrate; to an exposure apparatus; and to a device manufacturing method.

Description of Related Art

Semiconductor devices and liquid crystal display devices are manufactured through the so-called photolithography technique, by which a pattern formed on a mask is transferred onto a photosensitive substrate. The exposure apparatus used in the photolithography process has a mask stage that supports a mask and a substrate stage that supports a substrate, and while successively moving the mask stage and the substrate stage, transfers the mask pattern, via a projection optical system, onto the substrate. In recent years, to address the increasingly high integration of device patterns, increasingly high resolution of the projection optical system has been desired. The shorter the exposure wavelength used is, and, also, the larger the numerical aperture of the projection optical system is, the higher the resolution of the projection optical system becomes. For this reason, the exposure wavelength used for the exposure apparatus is becoming shorter and shorter year by year, and the numerical aperture of the projection optical system is also becoming larger and larger. In this context, the presently dominant exposure wavelength is 248 nm from a KrF excimer laser, but a still shorter wavelength of 193 nm from an ArF excimer laser is now gradually being put to practical use.

In addition, when performing exposure, the depth of focus (DOF) is an important factor along with the resolution. The resolution R and the depth of focus δ are respectively expressed by the following formulas:

$$R = k_1 \cdot \lambda / NA, \quad (1)$$

$$\delta = \pm k_2 \cdot \lambda / NA^2, \quad (2)$$

where λ is the exposure wavelength, NA is the numerical aperture of the projection optical system, and $k_1$ and $k_2$ are process coefficients. It can be seen from formulas (1) and (2) that if, to enhance the resolution R, the wavelength λ, is made shorter and the numerical aperture is made larger, then the depth of focus δ becomes narrower.

When the depth of focus δ becomes too narrow, it becomes difficult to make the substrate surface coincide with the image plane of the projection optical system, and thus there occurs the possibility that the focus margin during the exposure operation will be insufficient. To address this problem, the liquid immersion method, which is disclosed in, e.g., PCT International Publication No. WO 99/49504, has been proposed as a method to make the exposure wavelength shorter in effect and to make the depth of focus broader. This liquid immersion method is designed to, by filling the space between the under surface of the projection optical system and the substrate surface with a liquid, e.g., water or organic solvent, to form a liquid immersion region and thus by taking advantage of the fact that the wavelength of the exposure light in the liquid becomes 1/n times (n is the refractive index of the liquid and is generally about 1.2 to 1.6) of that in the air, improve the resolution and, at the same time, enlarge the depth of focus by approximately n times.

By the way, with the above-described related art, there are problems as described below. The above-described prior art has adopted the configuration in which the space between the image plane side end face of the projection optical system and the substrate (wafer) is locally filled with a liquid, and when exposing shot areas around the center of the substrate, the liquid does not flow out to the outside of the substrate. However, when, as shown by the schematic of FIG. 27, projection area 100 of the projection optical system is applied to peripheral area (edge area) E of substrate P for the purpose of exposing edge area E of substrate P, the liquid flows out to the outside of substrate P, which leads to the disadvantage that the liquid immersion region is not formed well, thus deteriorating the pattern image projected. Furthermore, there also arises the disadvantage that the liquid that flowed out causes mechanical parts, etc. in the vicinity of the substrate stage that supports substrate P to rust or causes electric leakage of the stage drive system, etc. Moreover, if the liquid that flowed out finds its way over to the underside surface of the substrate and penetrates into the space between the substrate and the substrate stage (substrate holder), there also arises the disadvantage that the substrate stage cannot hold the substrate well. In addition, air bubbles may come to be mixed in the liquid due to the height difference or gap between substrate P and the substrate stage, and, in this case, there arises the disadvantage, for example, that the exposure light is scattered under the influence of the air bubbles or that the pattern does not focus into an image on substrate P because of the bubbles. Besides, also when the liquid penetrates into the above-mentioned gap, rust or electric leakage may be induced.

SUMMARY OF THE INVENTION

The present invention has been made in consideration of such situations, and its objective is to provide an exposure method, a substrate stage, an exposure apparatus, and a device manufacturing method, by which, in the case of performing exposure process with the space between a projection optical system and a substrate being filled with a liquid, the exposure can be done in a condition that a liquid immersion region is formed well, even when exposing edge areas of the substrate.

To resolve the above-described problems, the present invention adopts the following configurations that are illustrated in the embodiments and correspond to FIGS. 1 to 26.

An exposure method of the present invention is an exposure method wherein a substrate is exposed by projecting an image of a pattern onto the substrate via a projection optical system and a liquid, the side surface of the substrate is applied with liquid-repellent treatment.

In accordance with the present invention, because the side surface of the substrate is applied with liquid-repellent treatment, penetration of the liquid into, for example, the space between a member (substrate stage) disposed so as to surround the substrate and the side surface of the substrate can be prevented. Thus, penetration of the liquid to the underside surface side of the substrate can be prevented. Furthermore, mixing of bubbles with the liquid, for example, is also prevented, and thus, the edge areas of the substrate can be exposed in a condition that the liquid immersion region is formed well.

An exposure method of the present invention is an exposure method wherein a substrate is exposed by projecting an image of a pattern onto the substrate via a projection optical system and a liquid, the underside surface of the substrate is applied with liquid-repellent treatment.

In accordance with the present invention, because the underside surface of the substrate is applied with liquid-repellent treatment, penetration of the liquid into, for example, the space between the substrate holder that holds the underside surface of the substrate and the underside surface of the substrate can be prevented. Therefore, the exposure can be performed with the substrate being held well.

A substrate stage of the present invention is a substrate stage that is used in liquid immersion exposure wherein a substrate is exposed by projecting an image of a pattern onto the substrate via a projection optical system and a liquid and that is movable while holding the substrate, at least a part of its surface is liquid-repellent.

In accordance with the present invention, by making the surface of the substrate stage liquid-repellent, while suppressing scattering of the liquid, flowing out of the liquid to the outside of the substrate stage, mixing of bubbles with the liquid, penetration of the liquid into the inside of the substrate stage, etc., the edge areas of the substrate can be exposed in a condition that the liquid immersion region is formed well.

A substrate stage of the present invention is a substrate stage that is used in liquid immersion exposure wherein a substrate is exposed by forming a liquid immersion region on a part of the substrate and by projecting a pattern image onto the substrate via a projection optical system and a liquid and that holds the substrate, the substrate stage has around the substrate a flat portion of which height is substantially equal to that of the substrate, in that a concave portion in which the substrate is disposed is formed inside the flat portion, and in that the exposure of the substrate is performed in a condition that a gap between the flat portion and the substrate is filled with the liquid.

In accordance with the present invention, even when the liquid immersion region is formed around the edge of the substrate, not only the liquid immersion region can be maintained in good condition, but also mixing of bubbles with the liquid of the liquid immersion region formed on a part of the substrate can be prevented. As a result, also around the edge of the substrate, good pattern images can be formed on the substrate.

An exposure apparatus of the present invention is provided with any one of the substrate stages described above. A device manufacturing method of the present invention uses the exposure method described above or an exposure apparatus described above provided with the substrate stage.

In accordance with the present invention, the edge areas of the substrate can be liquid immersion exposed in a condition that the liquid immersion region is formed well, and thus devices having a desired performance can be manufactured.

A substrate stage of the present invention is a substrate stage that is movable while holding a substrate as an object to be exposed, the substrate stage is provided with a first peripheral wall, a second peripheral wall formed inside the first peripheral wall, and a supporting portion formed inside the second peripheral wall and in that by applying a negative pressure to a space surrounded by the second peripheral wall, the substrate is held by the supporting portion.

In accordance with the present invention, because at least double peripheral walls are provided with around the supporting portion that supports the substrate, even if a liquid penetrates into the space between a member disposed so as to surround the substrate and the side surface of the substrate, penetration of the liquid to the underside surface side of the substrate or into a vacuum system for applying the negative pressure to the space can be prevented.

A substrate stage of the present invention is a substrate stage that is movable while holding a substrate as an object to be exposed, the substrate stage is provided with a supporting portion that supports the substrate, a flat portion which is disposed around the substrate supported by the supporting portion and is substantially coplanar with the surface of the substrate, and a gap adjustment portion for making the gap between a cut portion of the substrate supported by the supporting portion and the flat portion small.

In accordance with the present invention, by making the gap between the cut portion of the substrate and the flat portion surrounding the substrate small by means of the gap adjustment portion, penetration of the liquid into the space between the cut portion of the substrate and the flat portion can be suppressed. Thus, penetration of the liquid to, e.g., the underside surface side of the substrate can be prevented.

A substrate stage of the present invention is a substrate stage that is movable while holding a substrate as an object to be exposed, the substrate stage is provided with a peripheral wall and a supporting portion formed inside the peripheral wall, in that the peripheral wall is formed in accordance with the form or shape of a cut portion of the substrate, and in that by applying a negative pressure to a space surrounded the peripheral wall, the substrate is held by the supporting portion.

In accordance with the present invention, by forming the peripheral wall in accordance with the form of the cut portion of the substrate, the disadvantage that a large gap would be formed between the substrate and the peripheral wall will be suppressed, thus allowing the space surrounded by the peripheral wall to have smoothly a negative pressure. Thus, the substrate can be held well by the supporting portion, and, further, penetration of the liquid to the underside surface side of the substrate and/or into the space can be suppressed.

A substrate stage of the present invention is a substrate stage that is movable while holding a substrate as an object to be exposed, the substrate stage is provided with a supporting portion for holding the substrate and a plurality of gas-suction ports for sucking and holding the substrate and in that the gas-sucking force near a cut portion of the substrate is made to be smaller than the gas-sucking force therearound.

In accordance with the present invention, by making the gas-sucking force via the gas-suction port(s) near the cut portion, which tends to create a large gap between the substrate and the substrate stage, smaller (weaker) than the gas-sucking force via the gas-suction ports therearound, the disadvantage that the liquid would penetrate into the space between the cut portion of the substrate and the substrate stage will be suppressed. Thus, penetration of the liquid to the underside surface side of the substrate and/or into the gas-suction ports can be prevented.

An exposure apparatus of the present invention is by illuminating a substrate held by any one of the substrate stage described above with an exposure light via a projection optical system and a liquid, the substrate is liquid immersion exposed. A device manufacturing method of the present invention uses the exposure apparatus described above.

In accordance with the present invention, while suppressing penetration of the liquid to the underside side of the substrate, into the inside of the substrate stage, or into the vacuum system, the substrate can be liquid immersion exposed, and thus devices having a desired performance can be manufactured.

DETAILED DESCRIPTION OF THE INVENTION

Figure 1:
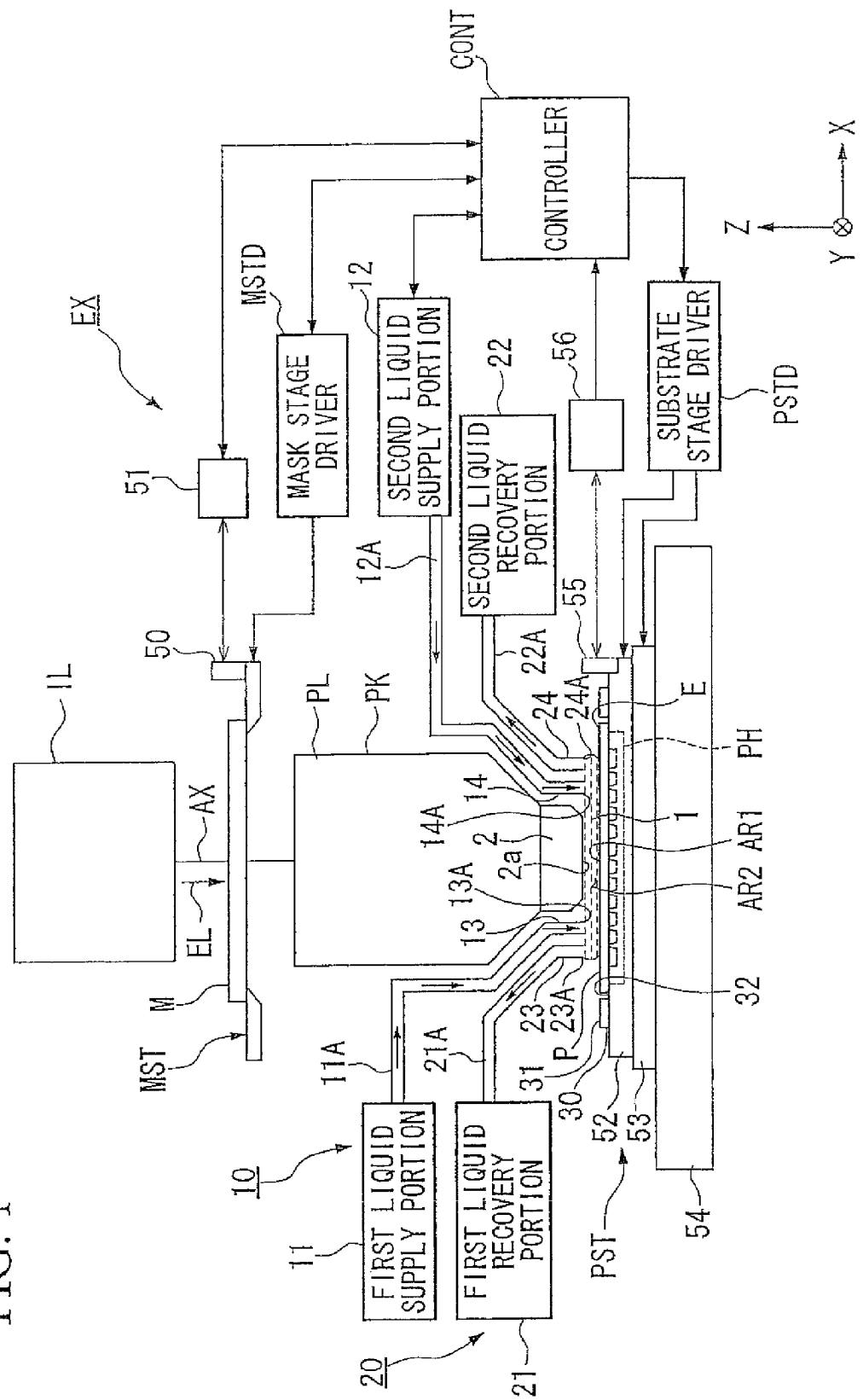
FIG. 1 is a schematic diagram showing an embodiment of an exposure apparatus of the present invention.

Now, referring to the drawings, an exposure apparatus provided with a substrate stage of the present invention will be described.

FIG. 1 is a schematic diagram showing an embodiment of an exposure apparatus of the present invention.

Referring to FIG. 1, exposure apparatus EX is provided with mask stage MST that supports mask M, substrate stage PST that supports substrate P, illumination optical system IL that illuminates mask M supported by mask stage MST with exposure light EL, projection optical system PL that projection exposes a pattern image of mask M illuminated with exposure light EL onto substrate P supported by substrate stage PST, and controller CONT that controls the overall operation of exposure apparatus EX.

Exposure apparatus EX of the embodiment is a liquid immersion exposure apparatus, to which a liquid immersion method is applied, with the exposure wavelength being shortened in effect, to improve the resolution and, at the same time, to widen the depth of focus. The exposure apparatus EX is provided with liquid supply system 10 that supply liquid 1 onto substrate P and liquid recovery system 20 that recover liquid 1 on substrate P. In the embodiment, purified water is used as liquid 1. Exposure apparatus EX, at least while transferring the pattern image of mask M onto substrate P, forms, by liquid 1 supplied from liquid supply system 10, liquid immersion region AR2 on at least a portion on substrate P, with the portion including a projection area AR1 of projection optical system PL. More specifically, exposure apparatus EX fills the space between optical element 2 located at the end of projection optical system PL and the surface (exposure surface) of substrate P with liquid 1, projects the pattern image of mask M onto substrate P via projection optical system PL and liquid 1 between projection optical system PL and the substrate P, and thus exposes substrate P.

Here, the embodiment will be described assuming, as an example, the case where as exposure apparatus EX, a scan type exposure apparatus (the so-called scanning stepper) in which while synchronously moving mask M and substrate P in mutually different directions (opposite directions) along the scanning direction, the pattern formed on mask M is exposed onto substrate P is used. In the following description, it is assumed that the direction that coincides with optical axis AX of projection optical system PL is referred to as the Z-axis direction, that the synchronous movement direction (the scanning direction), in a plane perpendicular to the Z-axis direction, of mask M and substrate P is referred to as the X-axis direction, and that the direction perpendicular to the Z-direction and to the X-direction is referred to as the Y-direction (the non-scanning direction). Furthermore, it is assumed that the direction around the X-axis, the direction around the Y-axis, and the direction around the Z-axis are respectively referred to as the θX-direction, the θY-direction, and the θZ-direction. It should be noted that a "substrate" referred to herein comprehends a semiconductor wafer over which a photoresist, a photosensitive material, is applied and that a "mask" comprehends a reticle on which a device pattern to be reduction projected onto a substrate is formed.

Illumination optical system IL is for illuminating mask M supported by mask stage MST with exposure light EL and includes an exposure light source, an optical integrator for uniforming the illuminance of a light flux emitted from the exposure light source, a condenser lens for condensing exposure light EL from the optical integrator, a relay lens system, a variable field stop for setting an illumination area on mask M formed by exposure light EL to be of a slit-like shape, etc. A specified illumination area on mask M is illuminated, by illumination optical system IL, with exposure light EL having a uniform illuminance distribution. As exposure light EL emitted from illumination optical system IL, for example, a bright line of ultraviolet region (g-line, h-line, i-line) emitted from a mercury lamp, a deep ultraviolet light (DUV light) such as a KrF excimer laser light (wavelength of 248 nm), and a vacuum ultraviolet light (VUV light) such as an ArF excimer laser light (wavelength of 193 nm) or an $F_2$ excimer laser light (wavelength of 157 nm) may be used. In the embodiment, an ArF excimer laser light is used. As described above, liquid 1 of the embodiment is purified water, and the purified water can transmit exposure light EL even when the exposure light EL is an ArF excimer laser light. Purified water can also transmit a bright line of ultraviolet region (g-line, h-line, or i-line) and a deep ultraviolet light (DUV light) such as a KrF excimer laser light (wavelength of 248 nm).

Mask stage MST is for supporting mask M, is two-dimensionally movable in a plane perpendicular to optical axis AX, i.e., in the XY-plane, and is finely rotatable in the θZ-direction. Mask stage MST is driven by mask stage driver MSTD such as a linear motor. Mask stage driver MSTD is controlled by controller CONT. On mask stage MST is provided with moving mirror 50. Furthermore, laser interferometer 51 is positioned at a position facing moving mirror 50. The two-dimensional position and the rotation angle of mask M on mask stage MST are measured by laser interferometer 51 in real time, and the measurement results are outputted to controller CONT. By driving mask stage driver MSTD based on the measurement results from laser interferometer 51, Controller CONT performs positioning of mask M supported by mask stage MST.

Projection optical system PL is for projection exposing the pattern of mask M onto substrate P at a predetermined projection magnification of β and is constituted by a plurality of optical elements, including optical element (lens) 2 disposed at the substrate P side end portion, and those optical elements are supported by lens barrel PK. In the embodiment, projection optical system PL is a reduction system of which projection magnification β is, e.g., ¼ or ⅕. It should be noted that projection optical system PL may also be either a unit magnification system or a magnifying system. Note that optical element 2 at the end portion of projection optical system PL of the embodiment is detachably (exchangeably) disposed relative to lens barrel PK, and liquid 1 of liquid immersion region AR2 is in contact with optical element 2.

Optical element 2 is made of fluorite. Since fluorite has a high affinity for water, liquid 1 can be made to be in tight contact with substantially the entire surface of liquid contact surface 2a of optical element 2. More specifically, since, in the embodiment, it is configured such that liquid (water) 1 having a high affinity for liquid contact surface 2a of optical element 2 is supplied, the highly tight contact is effected between liquid contact surface 2a of optical element 2 and liquid 1, so that the optical path between optical element 2 and substrate P can be assuredly filled with liquid 1. It should be noted that optical element 2 may be made of quartz, which has a high affinity for water. Furthermore, it may be configured such that liquid contact surface 2a of optical element 2 is applied with hydrophilic (lyophilic or liquid-attracting) treatment to enhance the affinity for liquid 1. In addition, since the portion around the end of lens barrel PK is to be in contact with liquid 1, at least the portion around the end is made of a rustproof metal, e.g., Ti (titanium).

Substrate stage PST is movable while supporting (holding) substrate P as an object to be exposed and is provided with Z stage 52 that holds substrate P via substrate holder PH, XY stage 53 that supports Z stage 52, and base 54 that supports XY stage 53. Substrate stage PST is driven by substrate stage driver PSTD such as a linear motor. Substrate stage driver PSTD is controlled by controller CONT. By driving Z stage 52, the Z-direction position (focus position) and the θX- and θY-direction positions of substrate P held by Z stage 52 are controlled. Furthermore, by driving XY stage 53, the XY-direction position (the position in the direction substantially parallel to the image plane of projection optical system PL) of substrate P is controlled. More specifically, Z stage 52, by controlling the focus position and inclination angle of substrate P, makes the surface of substrate P to coincide with the image plane of projection optical system PL by means of an autofocus system and an autoleveling system. XY stage 53 performs positioning of substrate P in the X-axis and Y-axis directions. It is to be noted that needless to say, the Z stage and the XY stage may be integrally constructed.

On substrate stage PST (Z stage 52) is provided with moving mirror 55. Furthermore, laser interferometer 56 is positioned at a position facing moving mirror 55. The two-dimensional position and the rotation angle of substrate P on substrate stage PST are measured by laser interferometer 56 in real time, and the measurement results are outputted to controller CONT. By driving substrate stage driver PSTN based on the measurement results from laser interferometer 56, controller CONT performs positioning of substrate P supported by substrate stage PST.

Furthermore, on substrate stage PST (Z stage 52) is provided with plate 30 surrounding substrate P. Plate portion 30 is provided integrally with Z stage 52; and inside plate portion 30 is formed concave portion 32. It should be noted that plate portion 30 and Z stage 52 may be separately provided. Substrate holder PH that holds substrate P is disposed in concave portion 32. Plate portion 30 has flat surface (flat portion) 31 of which height is substantially equal to that of the surface of the substrate P held by substrate holder PH disposed in concave portion 32.

Liquid supply system 10 is for supplying a predetermined liquid 1 onto substrate P and is provided with first liquid supply portion 11 and second liquid supply portion 12 that are capable of supplying liquid 1, first supply member 13 that has supply port 13A which is connected to first liquid supply portion 11 via supply pipe 11A having a flow channel to the supply portion and supplies onto substrate P liquid 1 delivered from first liquid supply portion 11, and second supply member 14 that has supply port 14A which is connected to second liquid supply portion 12 via supply pipe 12A having a flow channel to the supply portion and supplies onto substrate P liquid 1 delivered from second liquid supply portion 12. First supply member 13 and second supply member 14 are positioned close to the surface of substrate P and are respectively disposed in different positions in the surface direction of substrate P. Specifically, first supply member 13 of liquid supply system 10 is disposed on one scanning direction side (−X side) relative to projection area AR1, and second supply member 14 is disposed on the other side (±X side).

Each of first liquid supply portion 11 and second liquid supply portion 12 has a tank that stores liquid 1, a pressurizing pump, etc. and supplies liquid 1 onto substrate P via the pair of supply pipe 11A and the pair of supply members 13 and supply pipe 12A and supply member 14, respectively. In addition, the liquid supply operations of first liquid supply portion 11 and second liquid supply portion 12 are controlled by controller CONT, and controller CONT can control the per-unit-time liquid supply amounts onto substrate P by first liquid supply portion 11 and second liquid supply portion 12 independently of each other. Furthermore, each of first liquid supply portion 11 and second liquid supply portion 12 has a temperature adjustment mechanism for the liquid, and it is configured such that liquid 1 having substantially the same temperature as that inside a chamber (e.g., 23° C.) that accommodates the apparatus is supplied onto substrate P.

Liquid recovery system 20 is for recovering liquid 1 on substrate P and is provided with first recovery member 23 that has recovery port 23A positioned close to the surface of substrate P, second recovery member 24 that has recovery port 24A positioned close to the surface of substrate P, first liquid recovery portion 21 that is connected to first recovery member 23 via recovery pipe 21A having a flow channel to the recovery member, and second liquid recovery portion 22 that is connected to second recovery member 24 via recovery pipe 22A having a flow channel to the recovery member. Each of first liquid recovery portion 21 and second liquid recovery portion 22 has a suction device such as a vacuum pump, a tank that stores liquid 1 recovered, etc. and recovers liquid 1 on substrate P via the pair of first recovery member 23 and recovery pipe 21A and the pair of second recovery member 24 and recovery pipe 22A, respectively. The liquid recovery operations of first liquid recovery portion 21 and second liquid recovery portion 22 are controlled by controller CONT, and controller CONT can control the per-unit-time liquid recovery amounts by first liquid recovery portion 21 and second liquid recovery portion 22.

With respect to the above-described first supply member 13, second supply member 14, first recovery member 23, and second recovery member 24, at least the portions thereof that are in contact with the liquid are made of a material, which material includes stainless steels. In the embodiment, first supply member 13, second supply member 14, first recovery member 23, and second recovery member 24 are made of SUS 316, a stainless steel. Furthermore, with respect to first supply member 13, second supply member 14, first recovery member 23, and second recovery member 24, at least the liquid contact surfaces thereof that are in contact with the liquid are applied with some surface treatment. As such surface treatment, for example, "GOLDEP" treatment and "GOLDEP WHITE" treatment of Shinko Pantec Co., Ltd. can be listed.

Figure 2:
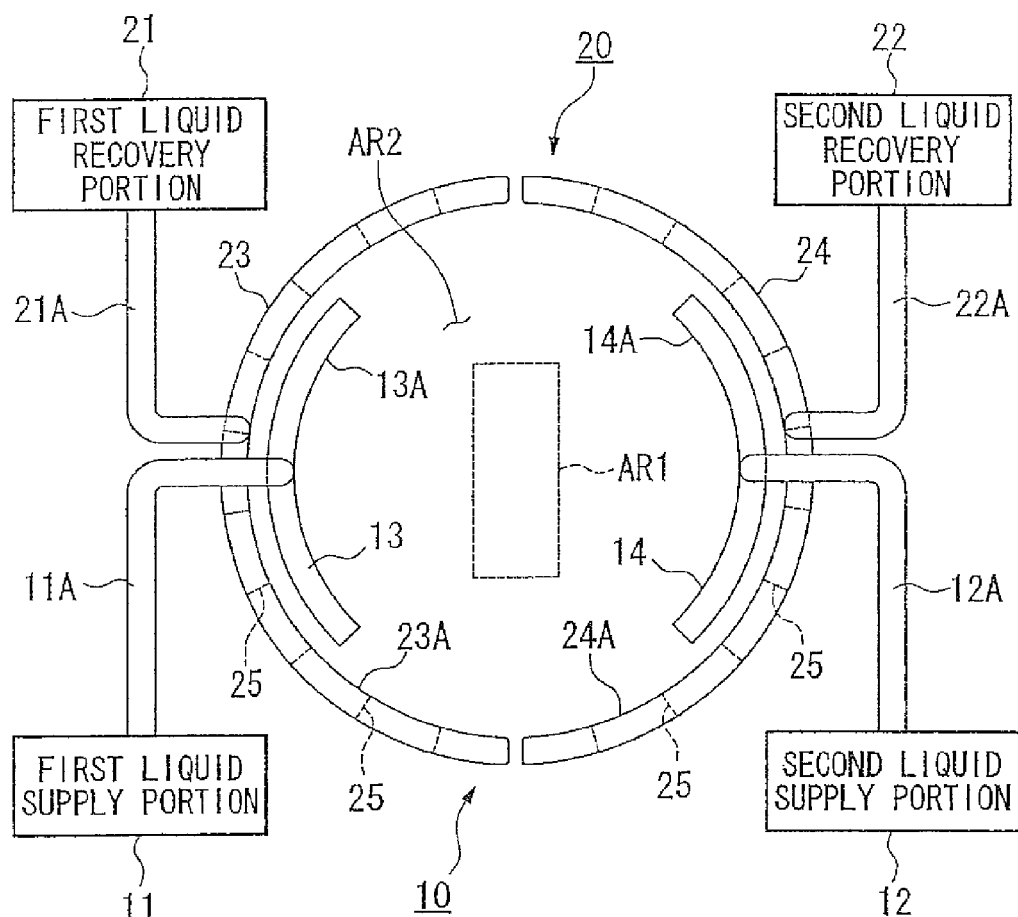
FIG. 2 is a schematic showing a liquid supply system and a liquid recovery system.

FIG. 2 is a plan view showing the outline configuration of liquid supply system 10 and liquid recovery system 20. As shown in FIG. 2, projection area AR1 of projection optical system PL is set to be slit-shaped (rectangle-shaped) having its longitudinal direction in the Y-direction (non-scanning direction), and liquid immersion region AR2 filled with liquid 1 is formed on a part of substrate P so as to include projection area AR1. Furthermore, first supply member 13, of liquid supply system 10, for forming liquid immersion region AR2 of projection area AR1 is disposed on one scanning direction side (−X side) relative to projection area AR1, and second supply member 14 is disposed on the other side (+X side).

Each of first supply member 13 and second supply member 14 is formed to be substantially arc-shaped when viewed from the top, and the Y-direction size of their respective supply port 13A and supply port 14A is set to be, at the least, larger than the Y-direction size of projection area AR1. Furthermore, supply port 13A and supply port 14A that are formed to be substantially arc-shaped when viewed from the top are arranged so that projection area AR1 is located therebetween. Liquid supply system 10 simultaneously supplies liquid 1 on both sides of projection area AR1 via supply port 13A and supply port 14A of first supply member 13 and second supply member 14.

Each of first recovery member 23 and second recovery member 24 of liquid recovery system 20 respectively has recovery port 23A and recovery port 24A that are formed to be continuous, arc-shaped and to face the surface of substrate P. In addition, a substantially annular-shaped recovery port is formed by first recovery member 23 and second recovery member 24 that are disposed so as to face each other. Recovery port 23A of first recovery member 23 and recovery port 24A of second recovery member 24 are disposed so as to surround first supply member 13 and second supply member 14 of liquid supply system 10, and projection area AR1. Furthermore, inside the recovery port, which is continuously formed so as to surround projection area AR1, are provided with a plurality of partition members 25.

Liquid 1 that has been supplied onto substrate P from supply port 13A and supply port 14A of first supply member 13 and second supply member 14 is then supplied so that liquid 1 is spread while causing the wetting between the lower end surface of the end portion (optical element 2) of projection optical system PL and substrate P. In addition, liquid 1 that has flowed out, relative to projection area AR1, to the outside of first supply member 13 and second supply member 14 is recovered by recovery port 23A and recovery port 24A of first recovery member 23 and second recovery member 24, which are disposed, relative to projection area AR1, outside first supply member 13 and second supply member 14.

In the embodiment, when substrate P is scan-exposed, the per-unit-time liquid supply amount of the liquid supplied, relative to the scanning direction, in front of projection area AR1 is set to be larger than the liquid supply amount of the liquid supplied in the side opposite thereto. For example, when substrate P is exposed while substrate P is moved in the +X-direction, controller CONT makes the liquid amount from the −X side relative to projection area AR1 (i.e., from supply port 13A) larger than the liquid amount from the +X side (i.e., from supply port 14A); on the other hand, when substrate P is exposed while substrate P is moved in the −X-direction, controller CONT makes the liquid amount from the +X side relative to projection area AR1 larger than the liquid amount from the −X side. Furthermore, the per-unit-time liquid recovery amount of the liquid recovered, relative to the scanning direction, in front of projection area AR1 is set to be smaller than the liquid recovery amount of the liquid recovered in the side opposite thereto. For example, when substrate P is moving in the +X-direction, the liquid recovery amount at +X side relative to projection area AR1 (i.e., at recovery port 24A) larger than the liquid recovery amount at the −X side (i.e., at recovery port 23A).

Figure 3:
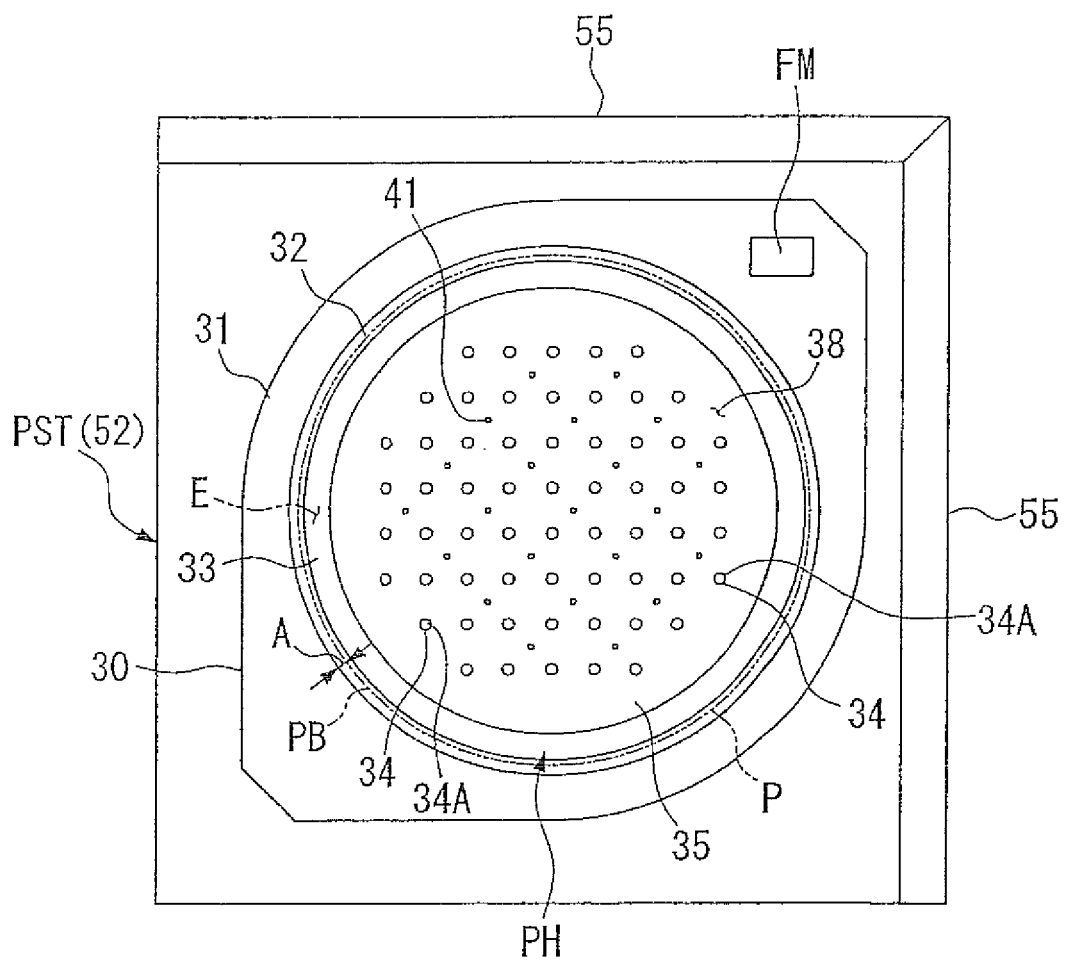
FIG. 3 is a plan view of a substrate stage.

FIG. 3 is a plan view of Z stage 52 of substrate stage PST, when viewed from above. Moving mirrors 55 are disposed on the edge portions of Z stage 52 that is rectangle-shaped when viewed from the top, which portions are perpendicular to each other. In addition, in substantially the center portion of Z stage 52 is formed concave portion 32; in concave portion 32 is disposed substrate holder PH that holds substrate P. Around substrate P is provided with, integrally with Z stage 52, plate portion 30 that has flat surface (flat portion) 31 of which height is substantially equal to the surface of substrate P.

Substrate holder PH has peripheral wall 33 that is substantially annular-shaped and a plurality of supporting portions 34 that are disposed inside peripheral wall 33 and hold (support) substrate P. Peripheral wall 33 is disposed around supporting portions 34, and supporting portions 34 are uniformly arranged inside peripheral wall 33. Flat surface 31 of plate portion 30 is disposed around substrate P supported by supporting portions 34 and is provided so that it is substantially coplanar with the surface of substrate P supported by supporting portions 34. In addition, a predetermined gap A is formed between side surface PB of substrate P supported by supporting portions 34 and plate portion 30. It should be noted that although, in the drawing, the top surface of peripheral wall 33 has a relatively wide width, it actually has a width of only about 1 to 2 mm.

Two corners of flat surface 31 of plate portion 30 are made to be wide; and on one of the wide portions is provided with fiducial mark FM that is used when mask M and substrate P are aligned with a predetermined position. Also, around substrate P on substrate stage PST are provided with various kinds of sensors such as an illuminance sensor. It is to be noted that although, in the embodiment, fiducial mark FM is provided on plate portion 30, a fiducial mark member, separate from plate portion 30, for disposing fiducial mark FM may be provided on substrate stage PST.

Figure 4:
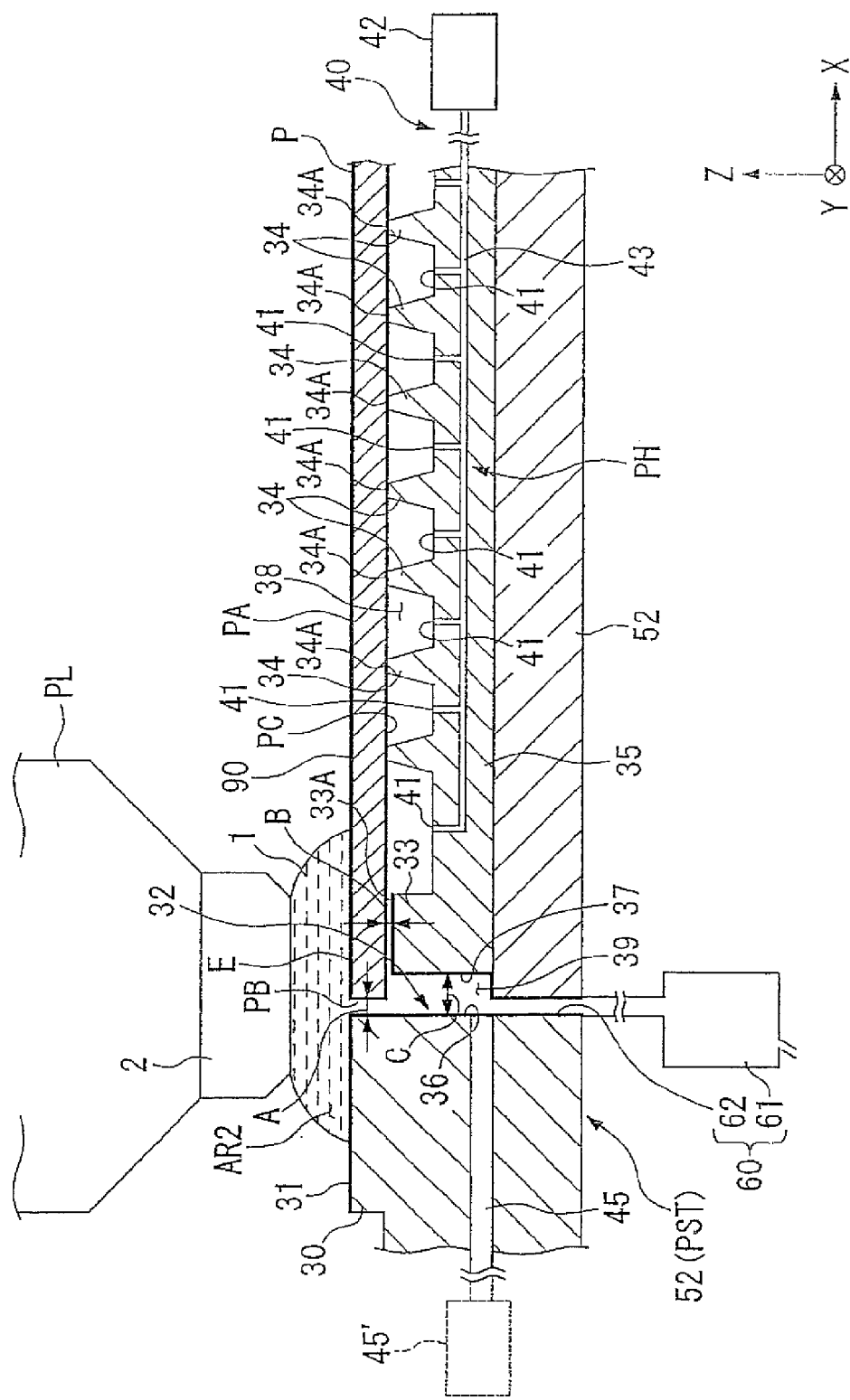
FIG. 4 is a cross sectional view showing a main part of an embodiment of a substrate stage of the present invention.

FIG. 4 is an enlarged, cross sectional view showing a main part of substrate stage PST holding substrate P. In FIG. 4, inside concave portion 32 of Z stage 52 (plate portion 30) is disposed substrate holder PH that holds substrate P. Concave portion 32 is formed inside flat surface 31, and inner side surface 36 of concave portion 32 is adjacent to flat surface 31. Peripheral wall 33 and supporting portions 34 formed inside peripheral wall 33 are provided on the substantially circular disc-shaped base portion 35 that constitutes a portion of substrate holder PH. Each of supporting portions 34 is trapezoid-shaped as viewed in the cross section, and substrate P is held, at its underside surface PC, by top surfaces 34A of the plurality of supporting portions 34. It should be noted that supporting portions 34 are illustrated in the drawing as being relatively large, but, actually, a large number of very small pin-like supporting portions are formed inside peripheral wall 33.

Furthermore, top surface 33A of peripheral wall 33 is a flat surface. The height of peripheral wall 33 is lower than the height of supporting portions 34, and gap B is formed between substrate P held by supporting portions 34 and peripheral wall 33. Gap B is smaller than gap A between inner side surface 36 of concave portion 32 and side surface PB of substrate P. For example, in consideration of the production tolerance of the outline of substrate P and of the positioning accuracy of substrate P, gap A is preferably about 0.1 to 1.0 mm. In contrast, gap B is about 2.0 to 5.0 μm. Furthermore, between inner side surface 36 of concave portion 32 and substrate holder PH's side surface 37 that faces inner side surface 36 is formed gap C. Here, the diameter of substrate holder PH is formed to be smaller than the diameter of substrate P, and thus gap A is smaller than gap C. It should be noted that, in the embodiment, no cut portion (orientation flat, notch, etc.) for aligning is formed on substrate P; substrate P is substantially circular; gap A is from 0.1 to 1.0 mm around the entire circumference of substrate P; and thus, penetration of the liquid can be prevented.

Surface PA, which is the exposure surface of substrate P, is applied with a photoresist (photosensitive material) 90.

In the embodiment, photosensitive material 90 is a photosensitive material for Arf excimer laser (e.g., TARF-P6100 produced by TOKYO OHKA KOGYO CO., LTD.) and has liquid-repellency (water-repellency), and its contact angle is about 70 to 80 degrees.

In addition, in the embodiment, side surface PB of substrate P is applied with liquid-repellent treatment (water-repellent treatment). More specifically, over side surface PB of substrate P is also applied the above-mentioned photosensitive material 90 having liquid-repellency. Furthermore, over underside surface PC of substrate P is also applied the above-mentioned photosensitive material 90, and thus the underside surface is applied with liquid-repellent treatment.

A part of the surface of Z stage 52 (substrate stage PST) is applied with liquid-repellent treatment and is thus liquid-repellent. In the embodiment, flat surface 31 and inner side surface 36 of Z stage 52 have liquid-repellency. In addition, a part of substrate holder PH is applied with liquid-repellent treatment and is thus liquid-repellent. In the embodiment, peripheral wall 33's top surface 33A and side surface 37 of substrate holder PH have liquid-repellency. To implement the liquid-repellent treatment on Z stage 52 and substrate holder PH, for example, a liquid-repellent material such as a fluoroplastic material or an acrylic plastic material is applied thereon, or a thin film made of the above-mentioned liquid-repellent material is attached thereon. As the liquid-repellent material to realize the liquid-repellency, a material nonsoluble in liquid 1 is used. It is to be noted that the entirety of Z stage 52 or substrate holder PH may be made of a material having liquid-repellency (i.e., fluoroplastic).

Substrate stage PST has suction device 40 for applying a negative pressure to first space 38 surrounded by peripheral wall 33 of substrate holder PH. Suction device 40 has a plurality of suction ports 41 provided on the top surface of base portion 35 of substrate holder PH, vacuum portion 42, provided outside substrate stage PST, including a vacuum pump, and flow channel 43 that is formed inside base portion 35 and that connects each of the plurality of suction ports 41 to vacuum portion 42. Suction ports 41 are provided at predetermined positions of the top surface of base portion 35 other than the positions occupied by supporting portions 34. Suction device 40 sucks and holds substrate P on supporting portions 34, by sucking the gas (air) in first space 38 formed by and between peripheral wall 33, base portion 35, and substrate P supported by supporting portions 34 and thus by applying a negative pressure to first space 38. It should be noted that since gap B between underside surface PC of substrate P and top surface 33A of peripheral wall 33 is very small, the negative pressure of first space 38 is maintained.

Substrate stage PST is provided with recovery section (recovery means) 60 that recovers liquid 1 that has flowed into second space 39 between inner side surface 36 of concave portion 32 and side surface 37 of substrate holder PH. In the embodiment, recovery section 60 has tank 61 that can store liquid 1 and flow channel 62 that is provided inside Z stage 52 and connects the space 39 to tank 61. In addition, the internal surface of channel 62 is also applied with liquid-repellent treatment.

In Z stage 52 is formed flow channel 45 that connects second space 39 between inner side surface 36 of concave portion 32 and side surface 37 of substrate holder PH to the space that is outside Z stage 52 (the atmosphere). The gas (air) can communicate, via flow channel 45, between second space 39 and the outside of Z stage 52; and second space 39 is set to have a pressure substantially equal to the atmospheric pressure.

Figure 5:
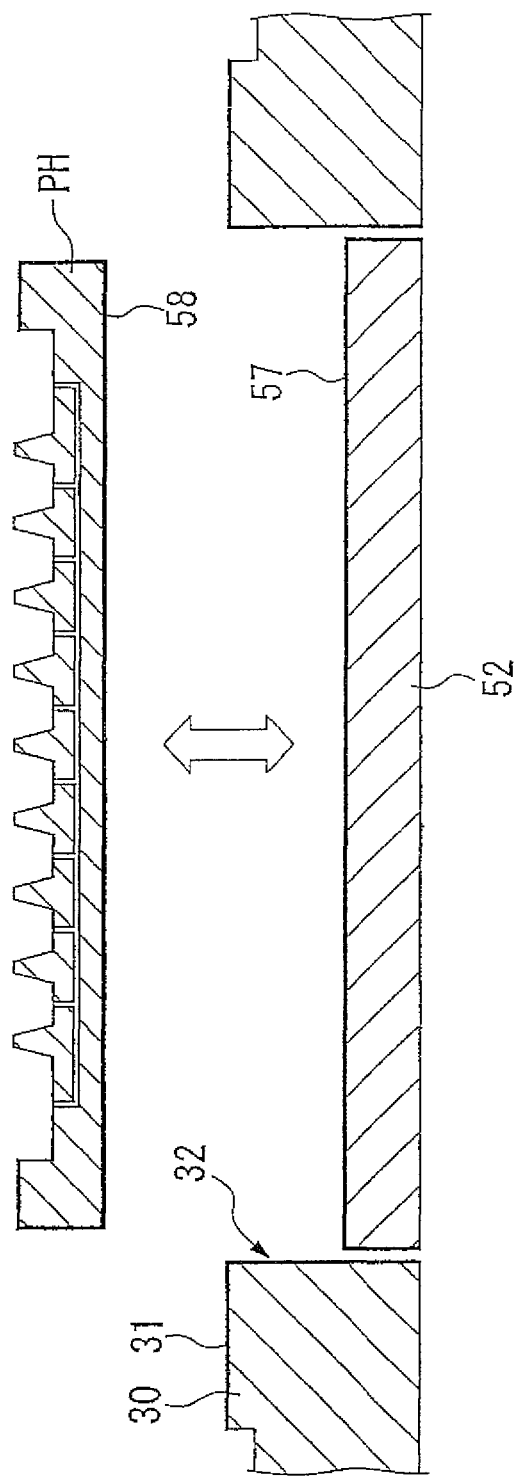
FIG. 5 is a schematic showing a substrate holder attachable to a substrate stage.

As shown in FIG. 5, in the embodiment, substrate holder PH is detachably provided on Z stage 52. Furthermore, contact surface 57 of Z stage 52 that comes into contact with substrate holder PH is applied with liquid-repellent treatment to have liquid-repellency; and also, underside surface 58 of substrate holder PH that comes into contact with Z stage 52 is applied with liquid-repellent treatment to have liquid-repellency. As described above, to implement the liquid-repellent treatment on contact surface 57 and underside surface 58, a liquid-repellent material such as a fluoroplastic material or an acrylic plastic material may be applied thereon, for example.

Next, a method by which edge areas E of substrate P are liquid immersion exposed by exposure apparatus EX having the above-described configuration will be described.

As shown in FIG. 4, when liquid immersion exposing edge areas E of substrate P, liquid immersion region AR2 of liquid 1 is formed so as to cover a part of surface PA of substrate P and a part of flat surface 31 of plate portion 30. In this situation, since side surface PB of substrate P and inner side surface 36 facing side surface PB are applied with liquid-repellent treatment, it is hard for liquid 1 of immersion region AR2 to penetrate into gap A, and liquid 1 hardly flows into gap A because of its surface tension. Thus, even when exposing edge areas E of substrate P, the liquid immersion exposure can be done with liquid 1 being maintained well beneath projection optical system PL. During the exposure, since flat surface 31 of plate portion 30 is also applied with liquid-repellent treatment, liquid 1 forming immersion region AR2 is prevented from excessively wetting and extending to the outside of plate portion 30; and thus, immersion region AR2 can be formed well, and the disadvantages such as flowing out or scattering of liquid 1 can be prevented as well. Also, since substrate P has no cut portion such as a notch, liquid 1 does not flow therethrough.

In addition, even if liquid 1 of immersion region AR2 slightly flows, via gap A, into second space 39, since each of underside surface PC of substrate P and top surface 33A of peripheral wall 33 is applied with liquid-repellent treatment and since gap B is sufficiently small, liquid 1 does not flow into first space 38 that is set to have a negative pressure in order to suck and hold substrate P on supporting portions 34. Accordingly, disadvantages such as the disadvantage that liquid 1 would flow into suction ports 41 and thus substrate P cannot be suck-and-held can be prevented.

Furthermore, liquid 1 that has flowed into second space 39 is recovered by and into tank 61 of recovery section 60 via flow channel 62, which suppresses flowing out (leakage), scattering, or the like of liquid 1 toward surrounding devices. Regarding the recovery process, since inner side surface 36 of concave portion 32 and side surface 37 of substrate holder PH, which surfaces form second space 39, and flow channel 62 are liquid-repellent, liquid 1 that has flowed into second space 39 flows smoothly through flow channel 62 and is recovered by and into tank 61, without staying in second space 39.

By the way, there can be conceived the possibility that due to the suction operation of suction device 40, the gas (air) in second space 39 flows, via gap B, into first space 38, which causes liquid 1 of immersion region AR2 to penetrate, via gap A, into second space 39, thus destabilizing the formation of immersion region AR2.

However, since gap C between inner side surface 36 of concave portion 32 and side surface 37 of substrate holder PH is set to be larger than gap A between side surface PB of substrate P and inner side surface 36 of concave portion 32 and since second space 39 is open to the atmosphere, most of the air that passes through gap B is from the air that has flowed into the space from the outside via flow channel 45 and has passed through gap C, and thus the air that passes through gap B includes little of the air (liquid 1) that has passed through gap A. Therefore, the suction force exerted on the liquid 1 via gap A can be made smaller than the surface tension of the liquid 1; and thus, the disadvantage that liquid 1 of immersion region AR2 would flow, via gap A, into second space 39 can be suppressed.

It should be noted that it may be configured such that by connecting gas (air) supply device 45' to one end portion of the flow channel opposite to the other end portion to which second space 39 is connected, thus second space 39 between inner side surface 36 of concave portion 32 and side surface 37 of substrate holder PH is made to have a positive pressure: more specifically, second space 39 is set to have a pressure slightly higher than the atmospheric pressure. Accordingly, the disadvantage that liquid 1 of immersion region AR2 would flow, via gap A, into second space 39 can be suppressed. In this case if second space 39 is made to have an excessive positive pressure, since there arises the disadvantage that the gas (air) in second space 39 flows, via gap A, into liquid 1 of immersion region AR2 and that bubbles come to be mixed in the liquid 1, second space 39 is preferably set to have a pressure substantially equal to the atmospheric pressure (i.e., slightly higher than the atmospheric pressure).

As described above, since side surface PB of substrate P and inner side surface 36, facing side surface PB, of concave portion 32 are made to be liquid-repellent, the disadvantage that liquid 1 would penetrate, via gap A, into second space 39 between Z stage 52 and substrate holder PH can be prevented. Thus, when exposing edge areas E of substrate P, the exposure can be performed in a condition that the liquid immersion region AR2 is formed well, while suppressing, for example, mixing of bubbles in liquid 1. In addition, since penetration of liquid 1 into second space 39 formed inside substrate stage PST can be prevented, the rusting or electric leakage of the apparatus can be prevented.

Furthermore, since underside surface PC of substrate P and top surface 33A, facing underside surface PC, of peripheral wall 33 are made to be liquid-repellent, the disadvantage that liquid 1 would penetrate, via gap 13, into first space 38 can be prevented. Thus, the disadvantage that liquid 1 would flow into suction ports 41 is avoided, and thus the exposure process can be performed in a condition that substrate P is suck-and-held well.

Furthermore, in the embodiment, since underside surface 58 of substrate holder PH attachable to Z stage 52 and contact surface 57 of Z stage 52 that comes into contact with substrate holder PH are applied with liquid-repellent treatment, even if liquid 1 penetrates into second space 39, penetration of liquid 1 between underside surface 58 of substrate holder PH and contact surface 57 of Z stage 52 can be suppressed. Thus, occurrence of rust on underside surface 58 of substrate holder PH and contact surface 57 of Z stage 52 can be prevented. Furthermore, although when liquid 1 penetrates between underside surface 58 of substrate holder PH and contact surface 57 of Z stage 52, there arises the situation that substrate holder PH and Z stage 52 adhere to each other and that it is difficult to separate them, the liquid-repellency of both has made them to be easily separated.

It should be noted that although, in the embodiment, substrate holder PH is attachable to substrate stage PST (Z stage 52), substrate holder PH and substrate stage PST may be integrally constructed.

It should be noted that although, in the embodiment, over the entire surfaces of substrate P's surface PA, side surface PB, and underside surface PC are applied photosensitive material 90, it may be configured such that only the region forming gap A, i.e., side surface PB of substrate P, and the region forming gap B, i.e., the region of underside surface PC of substrate P that faces top surface 33A of peripheral wall 33 are applied with liquid-repellent treatment. Furthermore, since when gap A is sufficiently small and when the liquid-repellency (contact angle) of the material applied to implement the liquid-repellent treatment is sufficiently large, the possibility that liquid 1 would penetrate, via gap A, into second space 39 further decreases, it may be configured such that without applying liquid-repellent treatment to underside surface PC of substrate P that forms gap B, only the side surface PB of substrate P is applied with liquid-repellent treatment.

Similarly, other than the configuration in which the entire surface of inner side surface 36 of concave portion 32 of substrate stage PST is applied with liquid-repellent treatment, it may be configured such that only the partial region of inner side surface 36 that faces side surface PB of substrate P is applied with liquid-repellent treatment. Furthermore, other than the configuration in which the entire surface of top surface 33A of peripheral wall 33 is applied with liquid-repellent treatment, it may be configured such that only a partial region of top surface 33A, e.g., an inner side, annular region thereof, is applied with liquid-repellent treatment. Still further, other than the configuration in which the entire surface of side surface 37 of substrate holder PH is applied with liquid-repellent treatment, it may be configured such that only a partial region thereof is applied with liquid-repellent treatment.

Furthermore, although, in the embodiment, both of the side surface of substrate P and inner side surface 36 that faces the side surface are applied with liquid-repellent treatment, both of side surface 37 of substrate holder PH and inner side surface 36 that faces side surface 37 are applied with liquid-repellent treatment, and both of the underside surface of substrate P and top surface 33A of peripheral wall 33 are applied with liquid-repellent treatment, it may be configured such that only one of each of those paired, facing surfaces is applied with liquid-repellent treatment.

Furthermore, in the embodiment, flat surface 31 of plate portion 30 is applied with liquid-repellent treatment; however, since, for example, when flat surface 31 of plate portion 30 is sufficiently wide and/or when the scanning speed of substrate P relative to liquid 1 is sufficiently low, the possibility that liquid 1 of immersion region AR2 would flow out to the outside of plate portion 30 is small, flowing out or scattering of liquid 1 can be prevented, without applying liquid-repellent treatment to flat surface 31. Furthermore, other than the configuration in which the entire surface of flat surface 31 is applied with liquid-repellent treatment, it may be configured such that a partial region thereof, e.g., an annular region thereof in the close vicinity of substrate P, is applied with liquid-repellent treatment.

Furthermore, the liquid-repellency degree of flat surface 31 of substrate stage PST may differ from that of inner side surface 36. In other words, the contact angle of liquid 1 at flat surface 31 may differ from the contact angle of liquid 1 at inner side surface 36.

It should be noted that although, in the embodiment, the height of peripheral wall 33 is lower than the height of supporting portions 34, and thus gap B is formed between underside surface PC of substrate P and top surface 33A of peripheral wall 33, underside surface PC of substrate P may be in contact with top surface 33A of peripheral wall 33.

Although, in the embodiment, to implement the liquid-repellent treatment on side surface PB and underside surface PC of substrate P, photosensitive material 90 having liquid-repellency is applied thereto, side surface PB and/or underside surface PC may be applied with a predetermined material having liquid-repellency (water-repellency) other than photosensitive material 90. For example, while there is the case where a protective layer (a layer that protects photosensitive material 90 from the liquid), called topcoat layer, is applied over photosensitive material 90 that is applied over surface PA of substrate P, the exposure surface, the topcoat layer forming material (e.g., fluoroplastic material) has a contact angle of, e.g., about 110 degrees and thus has liquid-repellency (water-repellency). Thus, the topcoat layer forming material may also be applied to side surface PB and/or underside surface PC of substrate P. Of course, a material having liquid-repellency, other than photosensitive material 90 and the topcoat layer forming material, may also be applied.

Furthermore, although, in the embodiment, to implement liquid-repellent treatment on substrate stage PST and/or substrate holder PH, for example, a fluoroplastic material or an acrylic plastic material is applied thereon, the above-described photosensitive material or topcoat layer forming material may be applied to substrate stage PST and/or substrate holder PH, and, contrariwise, the material used for the liquid-repellent treatment of substrate stage PST and/or substrate holder PH may be applied to side surface PB and/or underside surface PC of substrate P.

While the above-described topcoat layer is often formed to prevent liquid 1 of immersion region AR2 from infiltrating photosensitive material 90, even if, for example, an adhesion trace (so-called water mark) of liquid 1 is formed on the topcoat layer, by removing the topcoat layer after a liquid immersion exposure, a predetermined process such as a development process can be performed, with the water mark being already removed together with the topcoat layer. Here, when the topcoat layer is formed by, for example, a fluoroplastic material, the topcoat layer can be removed by using a fluorinated solvent. By virtue of the process, devices such as the device for removing the water mark (i.e., a water mark removing substrate washer) can be dispensed with, and with the simple configuration in which the topcoat layer is removed by a solvent, a predetermined process can be performed with the water mark being already removed.

Next, referring to FIG. 6, another exposure apparatus embodiment provided with a substrate stage of the present invention will be described. Here, in the following description, the same or equivalent constituent elements as those in the above-described embodiment are denoted by the same reference numerals, and their descriptions will be abridged or omitted.

Figure 6:
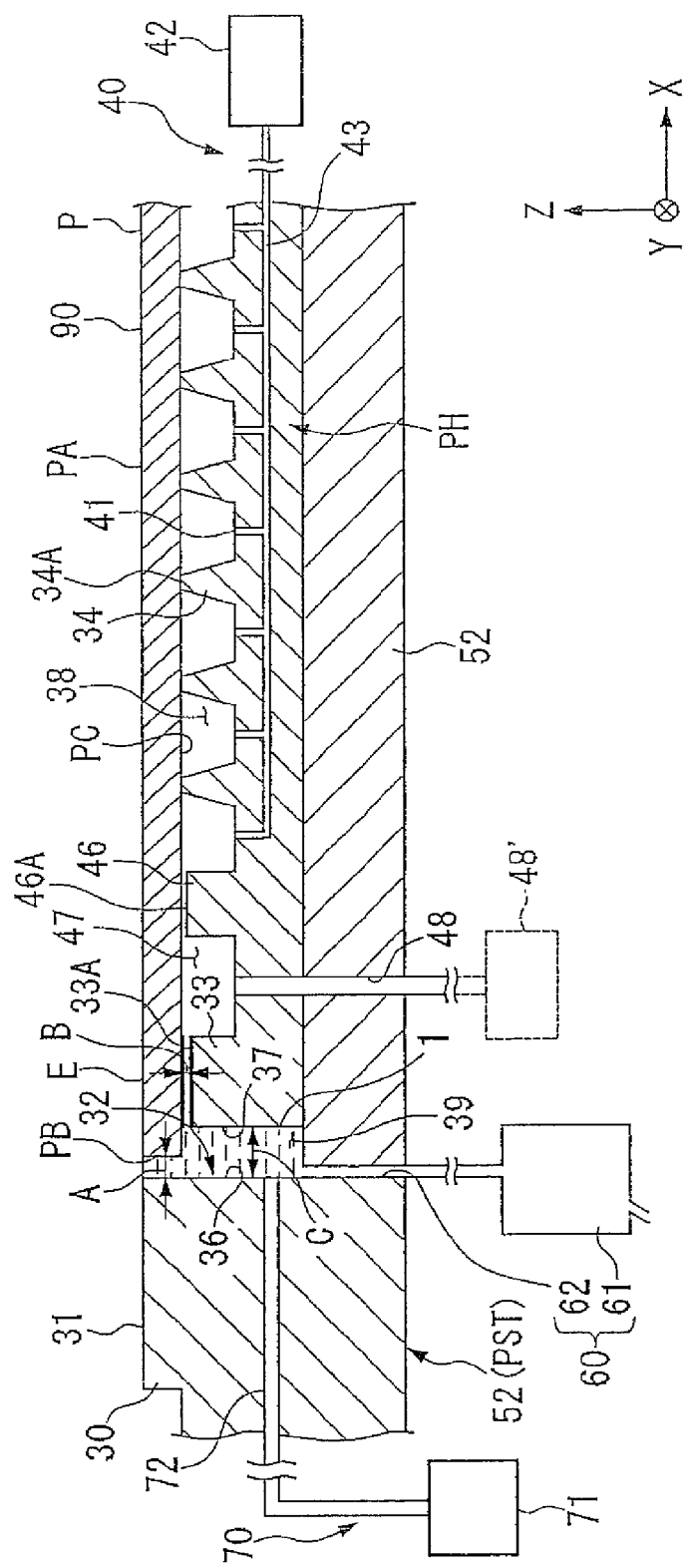
FIG. 6 is a cross sectional view showing a main part of another embodiment of a substrate stage of the present invention.

In substrate stage PST shown in FIG. 6, second space 39 between inner side surface 36 of concave portion 32 and side surface 37 of substrate holder PH can keep liquid 1. Here, side surface PB of substrate P of the embodiment is not applied with liquid-repellent treatment. Furthermore, with respect to underside surface PC of substrate P, only the partial region thereof that faces top surface 33A of peripheral wall 33 is applied with liquid-repellent treatment. It is to be noted that on surface PA of substrate P, the exposure surface, is applied photosensitive material 90. Furthermore, in the embodiment, regarding substrate stage PST, inner side surface 36 and side surface 37 of substrate holder PH are not applied with liquid-repellent treatment, but only the top surface 33A of peripheral wall 33 of substrate holder PH is applied with liquid-repellent treatment.

Regarding substrate holder PH, inside peripheral wall 33 is formed second peripheral wall 46.

Supporting portions 34 that support substrate P are formed inside second peripheral wall 46. The height of peripheral wall 33 is made to be substantially equal to that of second peripheral wall 46. The height of peripheral wall 33 and the height of second peripheral wall 46 are lower than that of supporting portions 34. It should be noted that although, in the drawing, the width of top surface 46A of second peripheral wall 46 is smaller than the width of top surface 33A of peripheral wall 33, the two height may be the same; or the width of top surface 46A of second peripheral wall 46 may be made to be larger than the width of top surface 33A of peripheral wall 33.

In addition, the height of top surface 46A of second peripheral wall 46 may differ from the height of top surface 33A of peripheral wall 33, and top surface 46A of second peripheral wall 46 may be in contact with the underside surface of substrate P.

Furthermore, between peripheral wall 33 and second peripheral wall 46 is formed the annular buffer space 47. Flow channel 48 is connected to buffer space 47. One end of flow channel 48 is connected to buffer space 47, and the other end is connected to the space that is outside substrate stage PST (the atmosphere). Thus, buffer space 47 between peripheral wall 33 and second peripheral wall 46 is open to the atmosphere, and the pressure of buffer space 47 is set to be substantially equal to the atmospheric pressure.

Furthermore, substrate stage PST is provided with liquid supply device 70 that can supply the liquid to second space 39. Liquid supply device 70 has supply portion 71 that can feed the liquid and flow channel 72 which is formed inside Z stage 52, one end of which is connected to second space 39, and the other end of which is connected to supply portion 71. Here, liquid supply device 70 has also the function of recovering liquid 1 in second space 39.

Figure 7A:
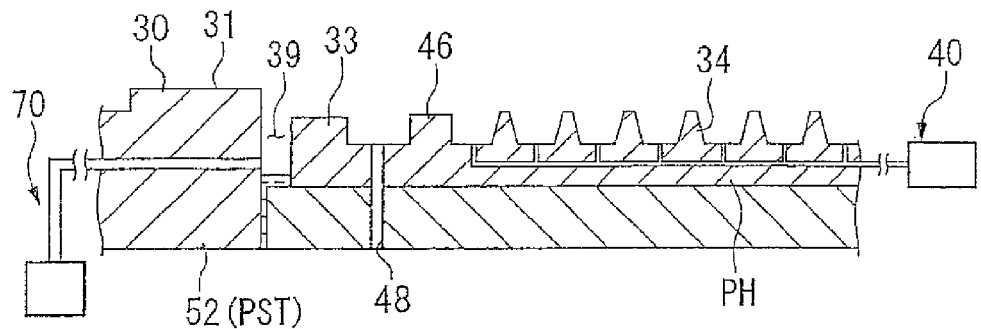
FIGS. 7A to 7C are schematics showing an example of a procedure for disposing a liquid in a space.
Figure 7B:
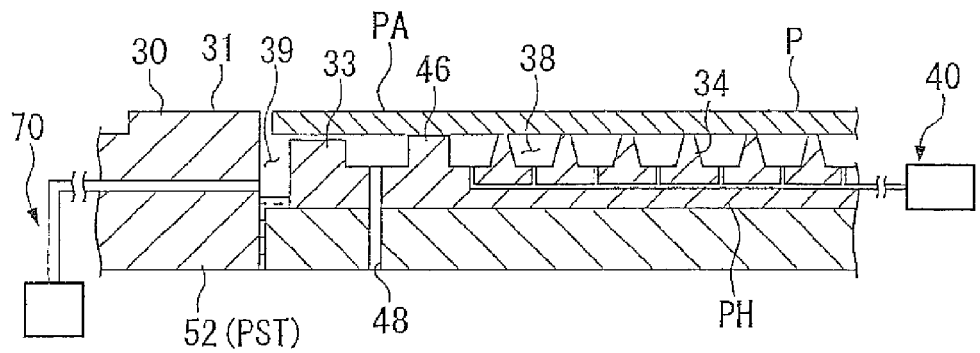
Figure 7C:
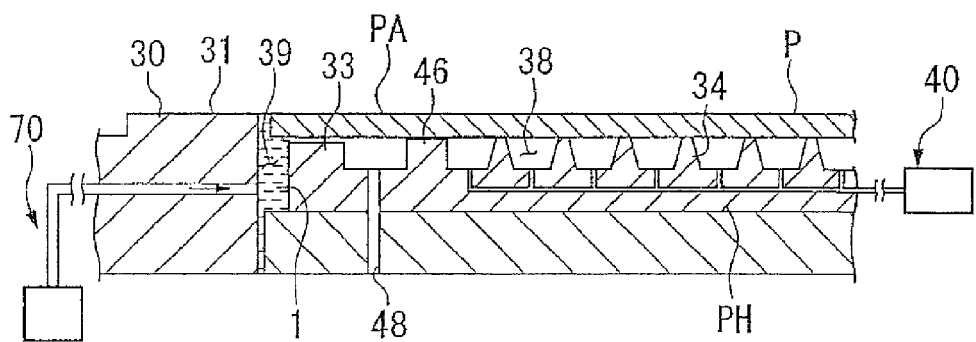

FIGS. 7A to 7C are the drawings showing the procedure for filling second space 39 with liquid 1. As shown in FIG. 7A, before substrate P is loaded (mounted) on substrate stage PST, the water level (height) of liquid 1 in second space 39 is set to be lower than the height of peripheral wall 33. It is to be noted that it may be configured such that, in this stage, liquid 1 has been removed from second space 39. Next, as shown in FIG. 7B, after substrate P is loaded on substrate holder PH by a loading device, not shown, suction device 40 sucks the gas (air) in first space 38 surrounded by second peripheral wall 46 to apply a negative pressure to first space 38, and thus substrate P is suck-and-held by supporting portions 34 of substrate holder PH. Next, as shown in FIG. 7C, liquid 1 is supplied to second space 39 by liquid supply device 70, and by this, second space 39 is filled with liquid 1. Here, liquid supply device 70 supplies liquid 1 to second space 39 until the liquid reaches the height (water level) substantially equal to the height of flat surface 31 of plate portion 30 and of the surface of substrate P held by substrate holder PH.

It should be noted that after a liquid immersion exposure is performed, the operations described with reference to FIGS. 7A to 7C can be performed in reverse order. That is, after the liquid immersion exposure is performed, liquid supply device 70 combining the liquid recovery function recovers liquid 1 in second space 39. Next, suction device 40 stops the sucking and holding of substrate P by substrate holder PH. Next, an unloading device, not shown, unloads (carries out) substrate P on substrate holder PH.

With space 39 being filled with liquid 1, flat surface 31 of plate portion 30 and surface PA of substrate P are substantially coplanar with each other via the intervening liquid 1 of space 39. In other words, the gap between flat surface 31 and substrate P is filled with liquid 1. For this reason, even when liquid 1 is disposed on gap A to liquid immersion expose edge areas E of substrate P, disadvantages such as the disadvantage that bubbles would come to be mixed in the liquid 1 of immersion region AR2 are prevented, and the exposure can be performed in a condition that immersion region AR2 is formed well.

In this regard, since gap B is sufficiently small and since top surface 33A of peripheral wall 33 and the partial region, facing top surface 33A, of underside surface PC of substrate P are applied with liquid-repellent treatment, liquid 1 in second space 39 does not flow, via gap B, into buffer space 47. Furthermore, since buffer space 47 is open to the atmosphere and is set to have substantially the atmospheric pressure, even in a condition that suction device 40 has applied a negative pressure to first space 38, flowing into buffer space 47 of liquid 1 filling second space 39 can be prevented. Even if the liquid has slightly passed through gap B, buffer space 47 can capture the liquid that has penetrated thereto.

Substrate stage PST of the embodiment has the configuration in which the stage is provided with liquid supply device 70 that can supply liquid 1 to second space 39 and can also recover liquid 1 in second space 39. By virtue of this configuration, liquid 1 can be freely supplied or recovered depending on whether substrate P is mounted on substrate holder PH, and thus flowing out of liquid 1 toward surrounding devices can be prevented. More specifically, when filling second space 39 with liquid 1, it is conceivable, for example, that by arranging liquid 1 of immersion region AR2 on gap A and by applying a negative pressure to buffer space 47 via flow channel 48, second space 39 is made to be filled with the liquid from liquid 1 on gap A; however, in this case, when substrate P is unloaded after a liquid immersion exposure is performed, since the water level of liquid 1 of second space 39 is higher than the height of peripheral wall 33, there arises the disadvantage that liquid 1 flows to, for example, the side of top surface 33A of peripheral wall 33 and/or of buffer space 47. However, since liquid supply device 70, which can supply liquid 1 to second space 39 and can also recover liquid 1 in second space 39, is provided, when unloading substrate P, liquid 1 in second space 39 can be recovered, and thus flowing out of liquid 1 can be prevented.

It should be noted that it may be configured such that by connecting gas (air) supply device 48' to one end portion of follow channel 48 opposite to the other end portion to which buffer space 47 is connected, buffer space 47 is made to have a positive pressure: more specifically, buffer space 47 is set to have a pressure slightly higher than the atmospheric pressure. By this setting, the disadvantage that liquid 1 of second space 39 would flow, via gap B, into buffer space 47 and furthermore into first space 38 can be suppressed. It is to be noted that if buffer space 47 is made to have an excessive positive pressure, since there arises the disadvantage that liquid 1 in second space 39 flows together with the gas (air) in buffer space 47, via gap A, into liquid 1 of immersion region AR2 and that bubbles come to be mixed in the liquid 1, buffer space 47 is preferably set to have a pressure substantially equal to the atmospheric pressure (i.e., slightly higher than the atmospheric pressure). Furthermore, it may also be configured such that the pressure of buffer space 47 can be freely adjusted, by making gas supply device 48' have a sucking function and by setting, by supply device 48', the pressure of buffer space 47 between peripheral wall 33 and second peripheral wall 46 to be, for example, slightly lower than the atmospheric pressure (low negative pressure) and be higher than the pressure of first space 38.

It should be noted that although, in the embodiment, it is configured such that the partial region of underside surface PC of substrate P is applied with liquid-repellent treatment, the entire surface of underside surface PC may be applied with liquid-repellent treatment, and side surface PB may also be applied with liquid-repellent treatment. Furthermore, side surface 37 of substrate holder PH and inner side surface 36 of concave portion 32 may be applied with liquid-repellent treatment. Furthermore, only one of the surfaces of underside surface PC of substrate P and top surface 33A, facing the underside surface, of peripheral wall 33 may be applied with liquid-repellent treatment. Furthermore, by, for example, applying with liquid-repellent treatment on top surface 46A of second peripheral wall 46, the top surface of second peripheral wall 46 may be made to be liquid-repellent. Of course, as with the above-described first embodiment and its modifications, substrate P, substrate holder PH, and substrate stage PST may also be made to have liquid-repellency.

Figure 8:
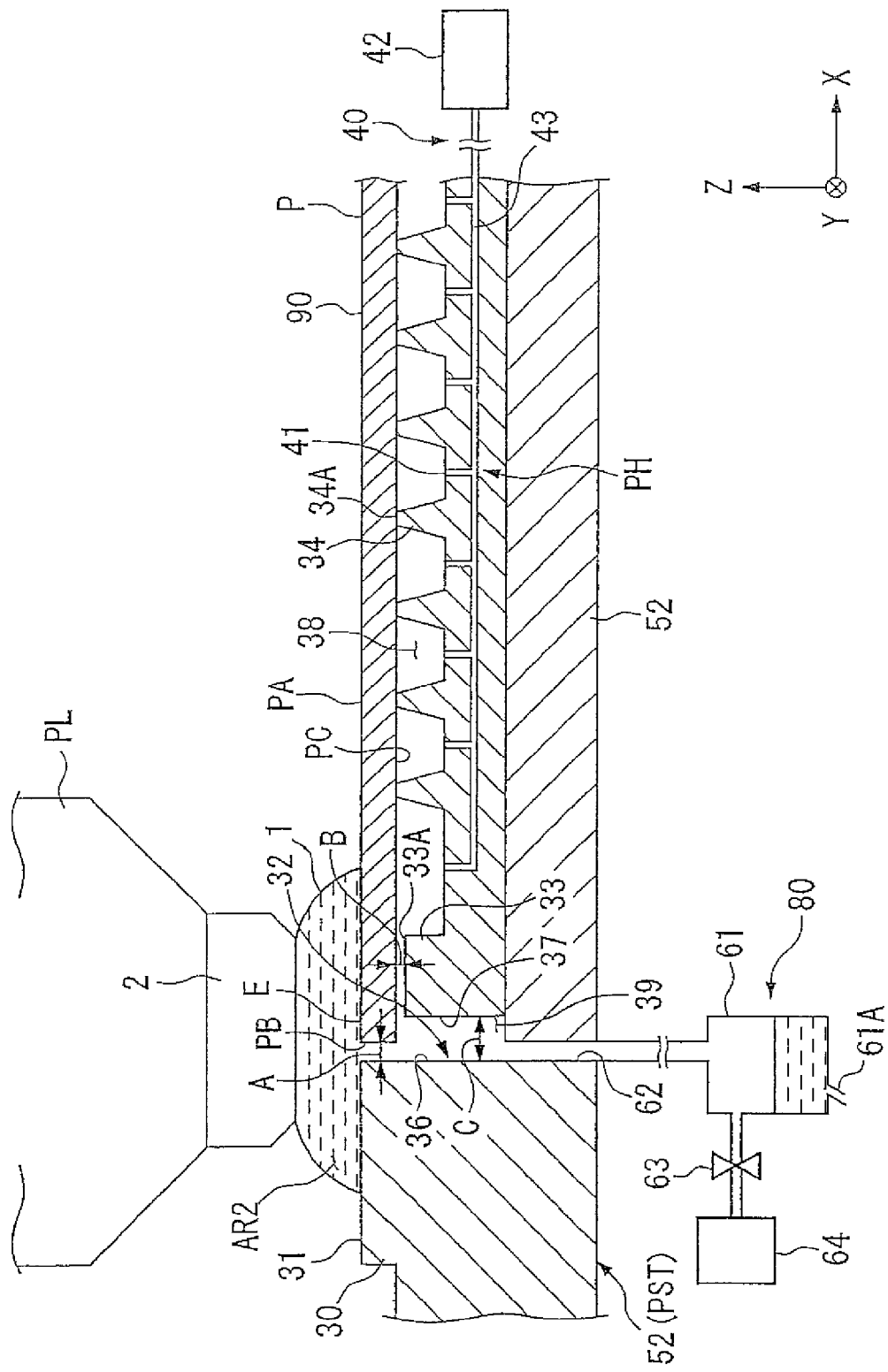
FIG. 8 is a cross sectional view showing a main part of another embodiment of a substrate stage of the present invention.

FIG. 8 is a drawing showing another embodiment of substrate stage PST of the present invention. In FIG. 8, substrate stage PST is provided with second suction device 80 that set the pressure of second space 39 between inner side surface 36 of concave portion 32 and side surface 37 of substrate holder PH to be lower than the pressure of first space 38 surrounded by peripheral wall 33. Second suction device 80 is connected to second space 39 via flow channel 62 and has tank 61 that can store liquid 1 and pump 64 that is connected to tank 61 via valve 63. The operations of second suction device 80 and suction device 40 are controlled by controller CONT.

In the embodiment, side surface PB and underside surface PC of substrate P are not applied with liquid-repellent treatment. Also, inner side surface 36 of concave portion 32, side surface 37 of substrate holder PH, and top surface 33A of peripheral wall 33 are not applied with liquid-repellent treatment. When exposing edge areas E of substrate P, controller CONT controls the operations of suction device 40 and second suction device 80 and makes the pressure of second space 39 lower than the pressure of first space 38. Thus, liquid 1 of immersion region AR2 on gap A, after flowing into second space 39 via gap A, is recovered by and into tank 61 of second suction device 80, without flowing to the side of first space 38 via gap B. Tank 61 has discharge flow channel 61A, and it is configured such that when liquid 1 has pooled therein up to a predetermined amount, the liquid is discharged through flow channel 61A.

As described above, with the pressure of second space 39 being made to be lower than the pressure of first space 38, liquid 1 that has passed through gap A is recovered by and into tank 61 of second suction device 80, without penetrating to the side of first space 38. Thus, with liquid 1 being prevented from flowing into suction ports 41, a liquid immersion exposure can be performed in a condition that substrate P is suck-and-held well. Furthermore, since liquid 1 that has passed through gap A is recovered by and into tank 61, the disadvantages such as flowing out or scattering to the outside of the device of liquid 1 can be avoided.

As for the embodiment of FIG. 8 also, as described in connection with the above-described embodiments and their modifications, at least a part of each surface of substrate P (e.g., its side surface), substrate holder PH (e.g., top surface 33A of peripheral wall 33), and substrate stage PST (e.g., flat surface 31 and inner side surface 36) can be made to be liquid-repellent.

Furthermore, although, in the embodiments of FIGS. 1 to 8, a partial surface(s) of substrate stage PST and a partial surface(s) of substrate holder PH are applied with liquid-repellent treatment, all surfaces thereof may be applied with liquid-repellent treatment.

For example, top surface 34A of supporting portions 34 of substrate holder PH may be applied with liquid-repellent treatment. By this treatment, formation of an adhesion trace (water mark) of the liquid is suppressed, and thus, the flatness of the supporting surface defined by the plurality of supporting portions 34 can be maintained.

In sum, by applying liquid-repellent treatment to the surfaces with which the liquid (water) may be in contact or to which the liquid may adhere, penetration, flowing out, and scattering of the liquid are suppressed. In addition, even if the liquid adheres thereto, the liquid can be easily removed.

By the way, in each of the above-described embodiments, substrate P is substantially circular, and by disposing the substantially annular, plate portion 30 around the substrate, gap A having a width smaller than a predetermined value is formed between plate portion 30 (inner side surface 36 of concave portion 32) and side surface PB of substrate P; however, even in the case where substrate P has a cut portion such as a notch portion or an orientation flat portion ("orifla" portion), by setting the shape of plate portion 30 (inner side surface 36 of concave portion 32) in accordance with the cut portion of substrate P, the width of gap A at the cut portion also can still be made to be smaller than the predetermined value.

Figure 9:
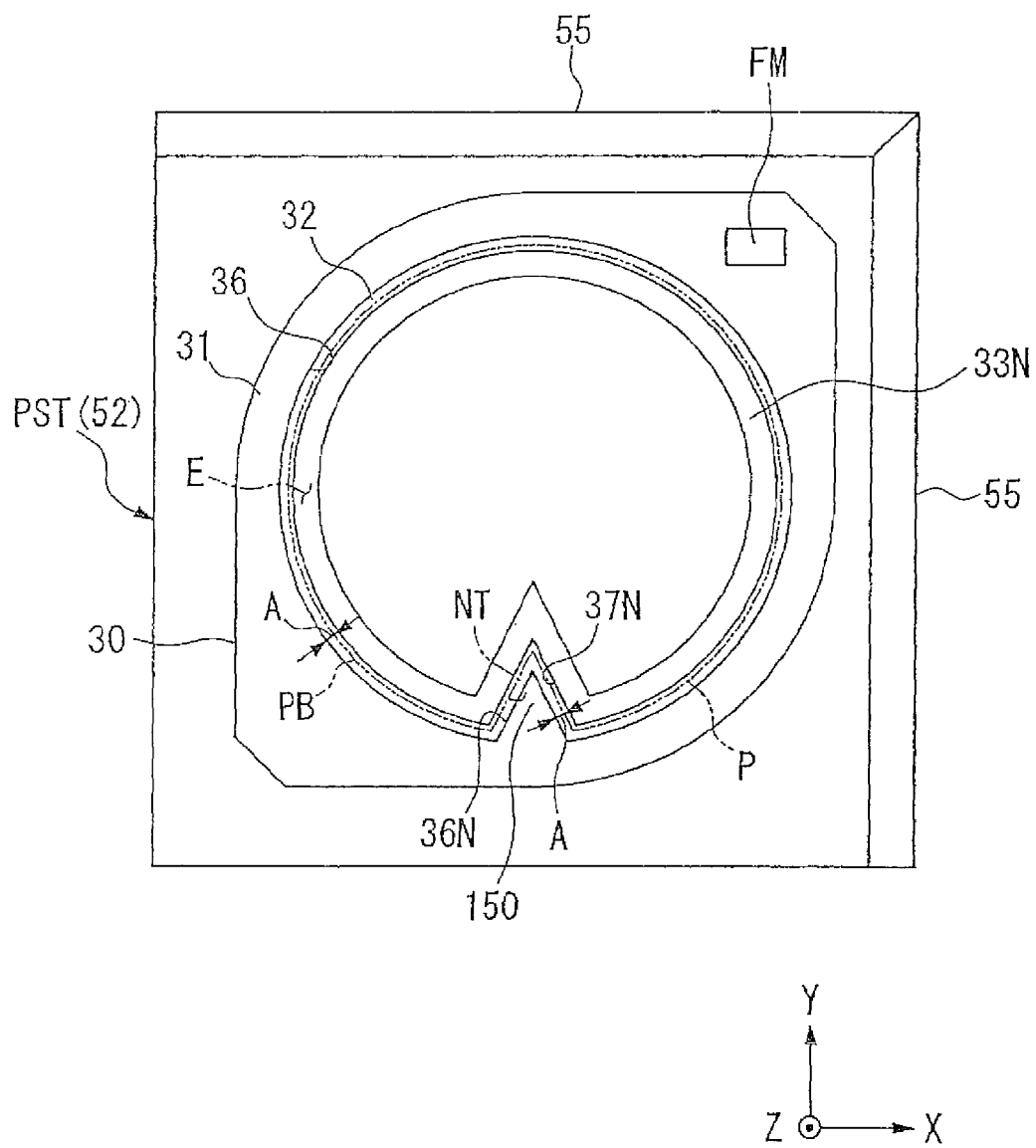
FIG. 9 is a plan view of a substrate stage related to another embodiment of the present invention.

FIG. 9 is a plan view of substrate stage PST supporting substrate P having notch portion NT, when viewed from above. As shown in FIG. 9, plate portion 30 is provided with protrusion portion 150 corresponding to the shape of notch portion NT of substrate P, and on inner side surface 36 of concave portion 32 of Z stage 52 is formed convex portion 36N so as to form protrusion portion 150. Protrusion portion 150 has the function, as a gap adjustment portion, of making the gap between notch portion NT of substrate P supported by supporting portions 34 and flat surface 31 of plate portion 30 small and is formed integrally with flat surface 31 (plate portion 30). Gap A is thus formed between notch portion NT and protrusion portion 150. At the protrusion portion 150, the surface facing substrate P (notch portion NT) and the top surface of protrusion portion 150 are applied with liquid-repellent treatment as with the embodiments earlier described; and, the side surface of notch portion NT of substrate P is also applied with liquid-repellent treatment. It is to be noted that to implement the liquid-repellent treatment on protrusion portion 150, for example, a fluoroplastic material is applied thereon, as described above, and to implement the liquid-repellent treatment on notch portion NT, a photosensitive material is applied thereon. Of course, the above-described topcoat layer forming material (e.g., fluoroplastic material) may also be applied on notch portion NT.

Furthermore, on side surface 37 of substrate holder PH is formed concave portion 37N, corresponding to the shape of notch portion NT, so as to face convex portion 36N of inner side surface 36 of concave portion 32, with the concave portion and convex portion being separated by a predetermined gap.

Furthermore, on the top surface of substrate holder PH that holds substrate P is provided peripheral wall 33N formed to correspond to the shape of notch portion NT; and, inside peripheral wall 33N are provided a plurality of supporting portions 34 and suction ports 41, as with those in FIG. 3 (the portions and ports being omitted in FIG. 9). Furthermore, as with the above-described embodiments, the top surface of peripheral wall 33N is liquid-repellent. When holding substrate P on supporting portions 34, first space 38 (omitted in FIG. 9) surrounded by peripheral wall 33N is made to have a negative pressure, with the gas being sucked via suction ports 41. Since the shape of peripheral wall 33N of substrate holder PH being also made to correspond to the shape of notch portion NT as describe above, even if the liquid penetrate into the stage through gap A of notch portion NT, flowing, of the liquid penetrated, to the inside of peripheral wall 33N can be prevented. It is to be noted that although notch portion NT is exaggerated in FIG. 9, the actual size thereof is about 2 to 3 mm, and the shape of notch portion NT is not limited to that shown in FIG. 9.

Figure 10:
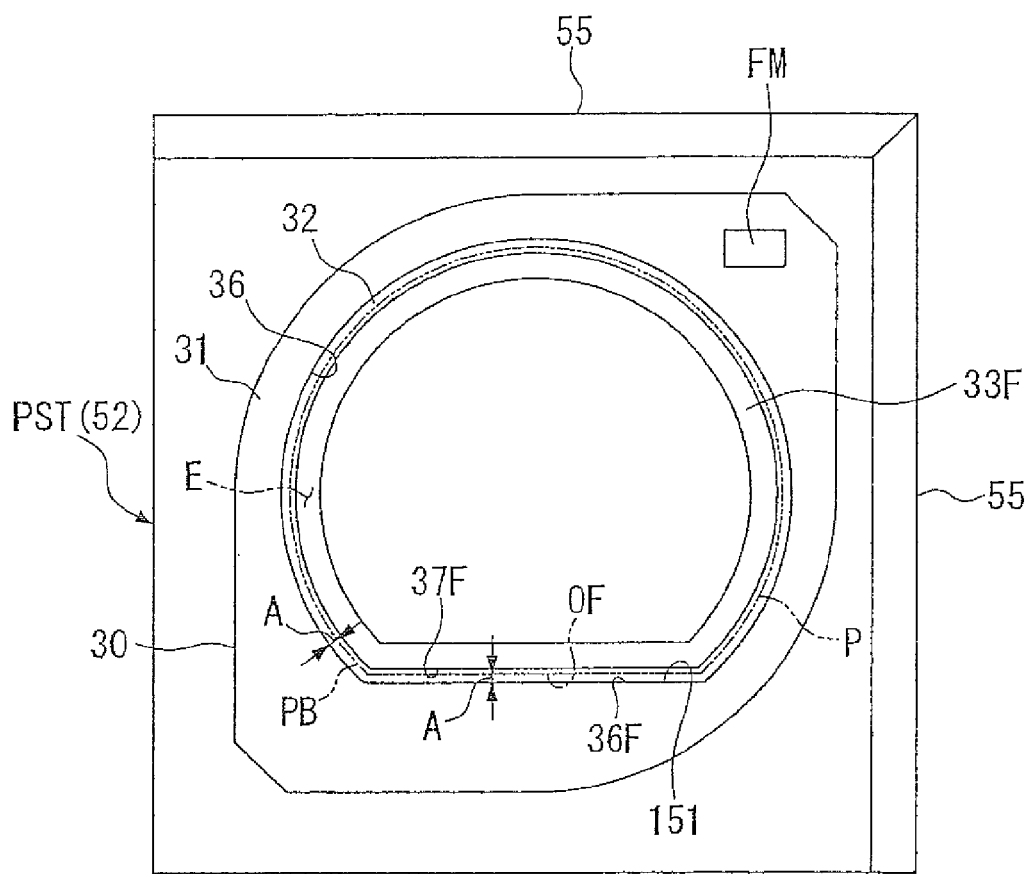
FIG. 10 is a plan view of a substrate stage related to another embodiment of the present invention.

FIG. 10 is a plan view of substrate stage PST supporting substrate P having "orifla" portion OF, when viewed from above. As shown in FIG. 10, plate portion 30 is provided with flat portion 151 corresponding to the shape of "orifla" portion OF of substrate P, and on inner side surface 36 of concave portion 32 of Z stage 52 is formed flat portion 36F so as to form flat portion 151. Flat portion 151 has the function, as a gap adjustment portion, of making the gap between orifla portion OF of substrate P supported by supporting portions 34 and flat surface 31 of plate portion 30 small and is formed integrally with flat surface 31 (plate portion 30). Gap A is thus formed between "orifla" portion OF and flat portion 151. The surface facing substrate P (orifla portion OF) and the top surface of flat portion 151 are applied with liquid-repellent treatment; and, "orifla" portion OF is also applied with liquid-repellent treatment. It is to be noted that to implement the liquid-repellent treatment on flat portion 151, for example, a fluoroplastic material is applied thereon, as described above, and to implement the liquid-repellent treatment on "orifla" portion OF, a photosensitive material is applied thereon.

Furthermore, on side surface 37 of substrate holder PH is formed flat portion 37F, corresponding to the shape of "orifla" portion OF, so as to face the flat portion of inner side surface 36 of concave portion 32, with flat portion 37F and the flat portion of inner side surface 36 being separated by a predetermined gap. Furthermore, on the top surface of substrate holder PH that holds substrate P is provided peripheral wall 33F formed to correspond to the shape of orifla portion OF; and, inside peripheral wall 33F are provided a plurality of supporting portions 34 and suction ports 41, as with those in FIG. 3 (the portions and ports being omitted in FIG. 10). Since the shape of peripheral wall 33F of substrate holder PH being also made to correspond to the shape of orifla portion OF as describe above, even if the liquid penetrate into the stage through gap A of orifla portion OF, flowing, of the liquid penetrated, to the inside of peripheral wall 33F can be prevented.

As described above, by setting the shape of plate portion 30 in accordance with the cut portion (notch portion or orifla portion) of substrate P, the width of gap A can still be made to be smaller than the predetermined value, and thus, penetration of liquid 1 between substrate P and substrate stage PST (plate portion 30) can be prevented.

By the way, when multiple substrates P are to be exposed, the size or shape of the cut portion (notch portion or orifla portion) may be different from one another, and in such case, there arises the possibility that gap A between the cut portion of substrate P and plate portion 30 cannot be kept to be smaller than the predetermined value. Furthermore, there is also the possibility that because of the production tolerance of the outline of substrate P and of the positioning accuracy of substrate P relative to substrate stage PST, gap A between the cut portion of substrate P and plate portion 30 cannot be kept to be smaller than the predetermined value.

Figure 11:
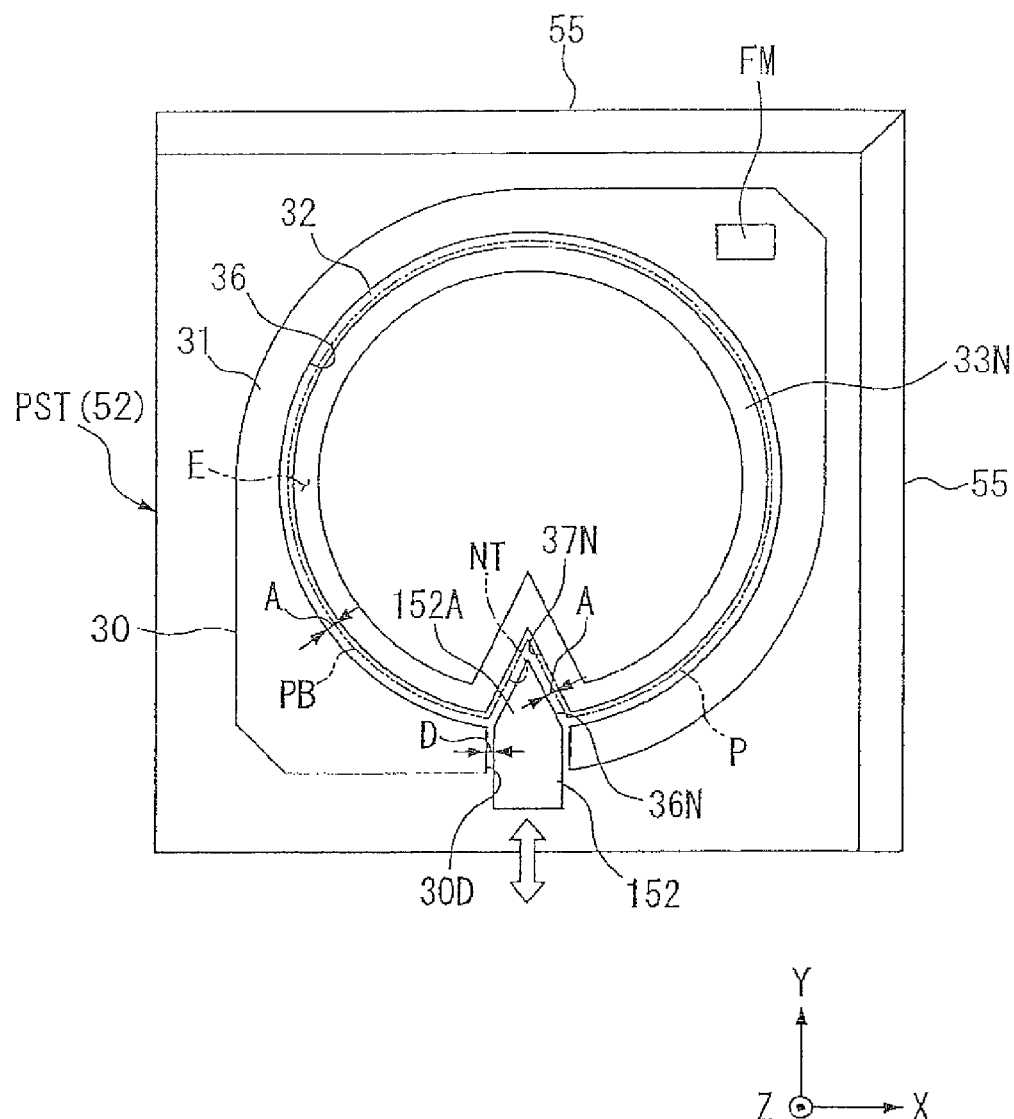
FIG. 11 is a plan view of a substrate stage related to another embodiment of the present invention.

To address the above problems, by movably providing protrusion member 152 having protrusion portion 152A corresponding to the shape of notch portion NT and by moving the protrusion member in the approaching or leaving direction relative to the substrate P, as shown in FIG. 11, gap A between notch portion NT and protrusion member 152 can be kept to be smaller than the predetermined value, even if, for example, the size of notch portion NT varies. In the embodiment shown in FIG. 11, protrusion member 152 is disposed in concave portion 30D provided in a portion of plate portion 30, and it is configured such that the protrusion member is moved along the XY-plane by a driving mechanism, not shown. By moving protrusion member 152 via the driving mechanism, controller CONT forms the predetermined gap A between protrusion member 152 and notch portion NT. Furthermore, as with the above-described case, regarding protrusion member 152, the surface facing substrate P (notch portion NT), the top surface, and the surface facing concave portion 30D of plate portion 30 are applied with liquid-repellent treatment; and, notch portion NT is also applied with liquid-repellent treatment. Here, although gap D is formed between protrusion member 152 and plate portion 30 (concave portion 30D), penetration of liquid 1 into gap D is prevented because gap D is smaller than gap A and because concave portion 30D of plate portion 30 and the side surface, of protrusion member 152, facing concave portion 30D of plate portion 30 are liquid-repellent. Note that description of the same portions as those of FIG. 9 is omitted.

Figure 12:
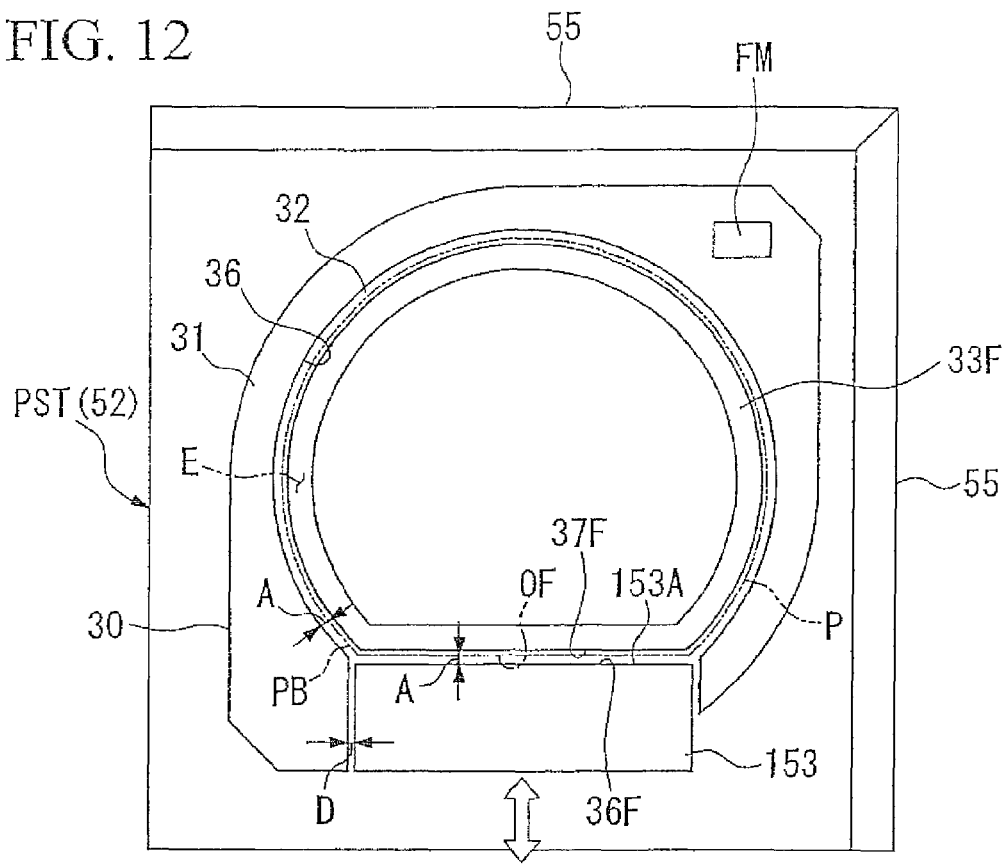
FIG. 12 is a plan view of a substrate stage related to another embodiment of the present invention.

FIG. 12 is a drawing showing flat member 153 that is movably provided and that has flat surface 153A corresponding to the shape of "orifla" portion OF of substrate P. By moving flat member 153 in the approaching or leaving direction relative to the substrate P, gap A between orifla portion OF and flat member 153 can be kept to be smaller than the predetermined value, even if, for example, the size of orifla portion OF varies.

In the embodiment shown in FIG. 12, flat member 153 disposed in concave portion 30D provided in a portion of plate portion 30, and it is configured such that the flat member is moved along the XY-plane by a driving mechanism, not shown. By moving flat member 153 via the driving mechanism, controller CONT forms the predetermined gap A between flat member 153 and "orifla" portion OF. Furthermore, as with the above-described case, regarding flat member 153, the surface facing substrate P (orifla portion OF), the top surface, and the surface facing concave portion 30D of plate portion 30 are applied with liquid-repellent treatment; and, "orifla" portion OF is also applied with liquid-repellent treatment. Here, although gap D is formed between flat member 153 and plate portion 30 (concave portion 30D), penetration of liquid 1 into gap D is prevented because gap D is smaller than gap A and because concave portion 30D of plate portion 30 and the side surface, of flat member 153, facing concave portion 30D of plate portion 30 are liquid-repellent. Note that description of the same portions as those of FIG. 10 is omitted.

It should be noted that by replaceably disposing protrusion member 152 (flat member 153) relative to substrate stage PST, by stocking beforehand multiple protrusion members 152 (flat members 153) having different shapes or sizes, and by replacing protrusion member 152 (flat member 153) in accordance with the shape or size of substrate P mounted on substrate stage PST, gap A can be kept to be smaller than the predetermined value.

It should be noted that not only the size or shape of protrusion member 152 (flat member 153) but also the manner in which protrusion member 152 (flat member 153) moves, e.g., the movement direction thereof, are not limited by the above-described embodiments; in sum, accomplishment of the condition that gap A in the vicinity of the cut portion of substrate P is smaller than the predetermined value would suffice.

It should be noted that while, in the embodiments, it is configured such that protrusion member 152 (flat member 153) is moved so that gap A is formed between the cut portion (notch portion or orifla portion) of substrate P and protrusion member 152 (flat member 153), it may also be configured such that plate portion 30 to be disposed around substrate P is disposed movably along the XY-plane to adjust gap A between substrate P and plate portion 30 to be smaller than the predetermined value. In this case, for example, the configuration in which plate portion 30 is divided into multiple parts and each of the divided parts are moved, along the XY-plane, in the approaching or leaving direction relative to the substrate P can be adopted. In implementing this configuration, by setting the each of gaps between the divided parts to have a gap through which the liquid cannot penetrate, the disadvantage that the liquid would penetrate to the inside of substrate stage PST can be avoided.

Furthermore, it may also be configured such that before substrate P is carried in (loaded) on substrate stage PST, the size and/or shape (deformation) of substrate P or the size and/or shape of the cut portion of substrate P is measured and then based on the measurement results, each members are moved so that gap A is made to be smaller than the predetermined value. By this, not only penetration of the liquid from gap A can be prevented more certainly, but also damage to the edge of substrate P can be prevented.

Furthermore, regarding the above-described embodiment of FIG. 6, there is the possibility that the liquid flows over top surface 33A of peripheral wall 33 (46); however, since the liquid that has flowed beyond top surface 33A of peripheral wall 33 can be captured by buffer space 47, flowing of the liquid into first space 38 can be prevented. It is to be noted that preparing for such case, it may be configured such that the liquid that has penetrated into buffer space 47 is recovered.

Figure 13:
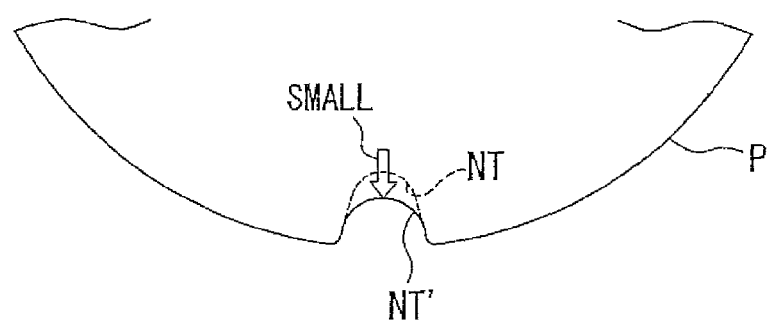
FIG. 13 is a drawing showing an embodiment of a substrate related to an exposure method of the present invention.

Next, another embodiment of the present invention will be described. In the embodiments described above with reference to FIGS. 9 to 12, it is configured such that to prevent liquid 1 from penetrating between the cut portion (notch portion or orifla portion) of substrate P supported supporting portions 34 and flat surface 31 of plate portion 30, protrusion portion 150, flat portion 151, the movable protrusion member 152, and the movable flat member 153 are, as gap adjustment portions, provided. On the other hand, as indicated by reference mark NT' of FIG. 13, by making notch portion NT' of substrate P small, as far as possible, to the extent that liquid 1 does not penetrate, penetration of liquid 1 between the notch portion of substrate P and substrate stage PST (plate portion 30) can also be prevented. Note that the not portion shown in FIG. 13 has a rounded shape having no acutely-angled portion.

Figure 14A:
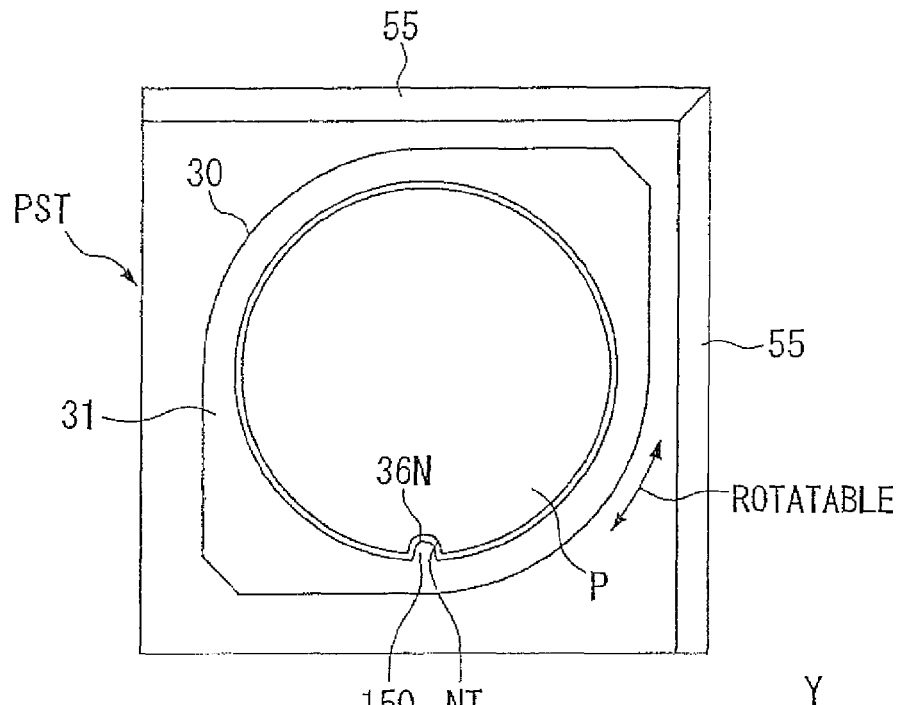
FIGS. 14A and 14B are plan views of a substrate stage related to another embodiment of the present invention.
Figure 14B:
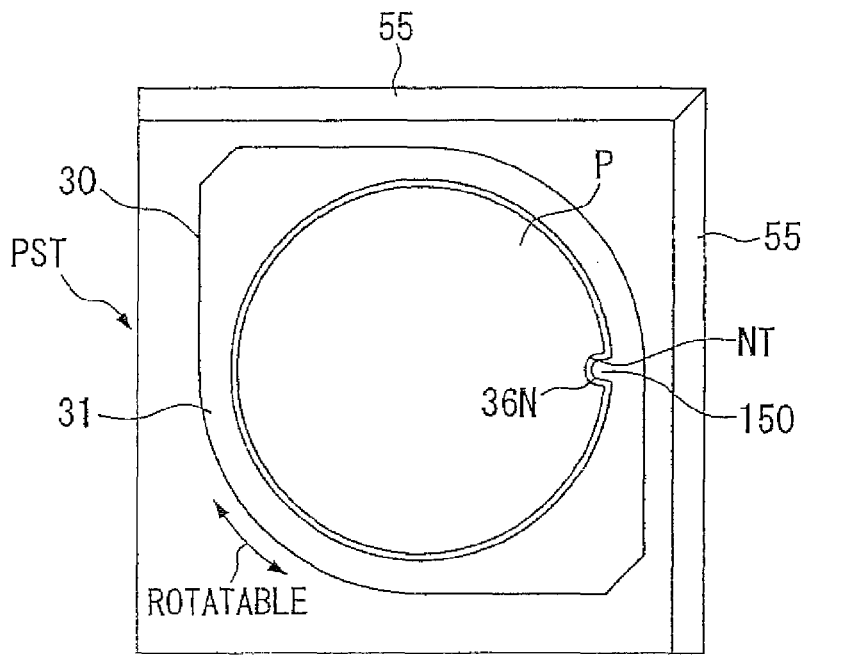

By the way, there is a case where when mounting substrate P on substrate stage PST, the substrate is mounted on substrate stage PST, with the position of cut portion being differently positioned relative to substrate stage PST, in accordance with the process condition of the circuit and/or with the pattern of mask M. For example, there is a case where when mounting a first substrate on substrate stage PST, the substrate is mounted in a condition that the cut portion is directed to the −Y side and where when mounting a second substrate on substrate stage PST, the substrate is mounted in a condition that the cut portion is directed to the +X side. To address this case, it may be configured such that by movably providing plate portion 30 having protrusion portion 150, plate portion 30 is rotated in accordance with the position of cut portion of substrate P supported by supporting portions 34. For example, when, as shown in FIG. 14A, making supporting portions 34 support substrate P so that notch portion NT is directed to −Y side, plate portion 30 is rotated so that protrusion portion 150 is directed to −Y side in accordance with the position of notch portion NT; and, when, as shown in FIG. 14B, making supporting portions 34 support substrate P so that notch portion NT is directed to +X side, plate portion 30 is rotated so that protrusion portion 150 is directed to +X side in accordance with the position of notch portion NT. In this case, although not shown in FIGS. 14A and 14B, substrate holder PH on which peripheral wall 33N having concave portion 37N also rotates in accordance with the position of notch portion NT. It may be, as described above, configured such that protrusion portion 150 (and convex portion 36N), a gap adjustment portion, is provided movably in the rotation direction (θZ-direction). Similarly, plate portion 30 having flat portion 151 and substrate holder on which peripheral wall 33F having flat portion 37F is formed may be provided so that they rotate in accordance with the position of "orifla" portion OF. By adopting such configurations, penetration of liquid 1 between plate portion 30 and substrate P (cut portion) can also be prevented, irrespective of the position of the cut portion of substrate P.

Also, it may be configured such that the totality of substrate stage PST is rotated so that protrusion portion 150 of plate portion 30 is aligned with the position of notch portion NT of substrate P supported by supporting portions 34.

Figure 15A:
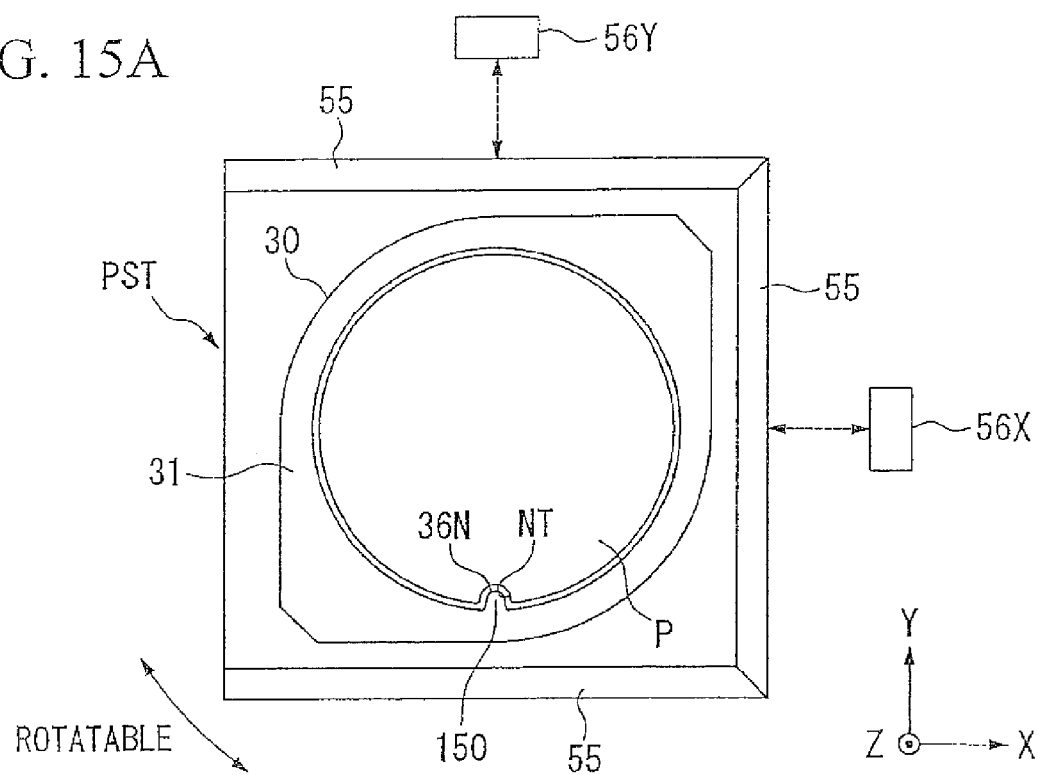
FIGS. 15A and 15B are plan views of a substrate stage related to another embodiment of the present invention.
Figure 15B:
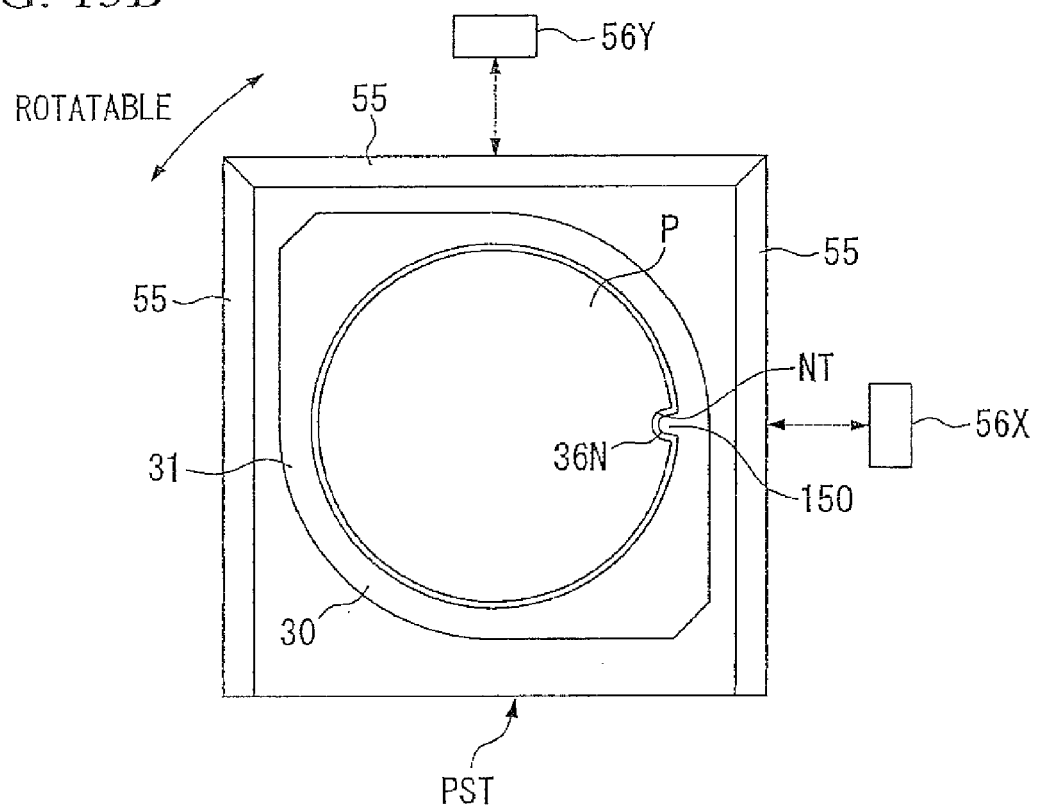

In FIG. 15A is shown the condition that notch portion NT is directed to the −Y side; in FIG. 15B is shown the condition that notch portion NT is directed to the +X side. Here, when, as shown in FIGS. 15A and 15B, for example, laser interferometer 56X is disposed in a position separated, on the +X side, from substrate stage PST, and laser interferometer 56Y is disposed in a position separated on the −Y side, by positioning moving mirror 55 on each of at least three edge portions of substrate stage PST formed in a rectangle-shape as viewed from the top, each of laser interferometers 56X and 56Y can be made to face either one of the moving mirrors 55, also when substrate stage rotates.

Figure 16A:
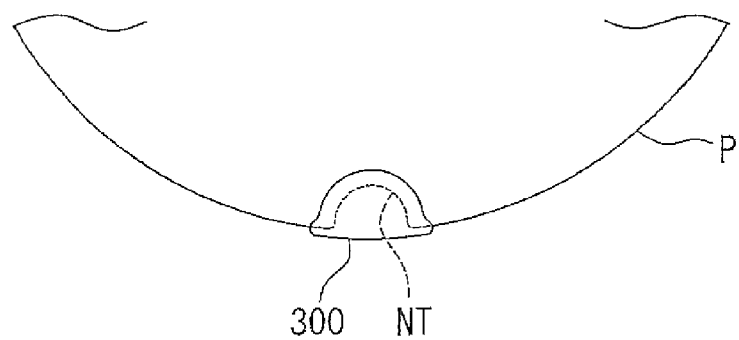
FIGS. 16A and 16B are drawings showing an embodiment of a substrate related to an exposure method of the present invention.

By the way, the cut portion of substrate P is primarily used during the pre-alignment process, a rough alignment process when substrate P is mounted on substrate stage PST. More specifically, with the position of the cut portion being first detected optically, the pre-alignment process is performed based on the detection results. Thus, as shown in FIG. 16A, by covering notch portion (cut portion) NT formed on substrate P with covering member 300 having light transmittance, notch portion NT can be optically detected via covering member 300, and, at the same time, the disadvantage that when substrate P is mounted on substrate stage PST, a large gap would be formed between plate portion 30 and notch portion NT (covering member 300) can be prevented. Similarly, it may be configured such that "orifla" portion OF is covered with a covering member.

Figure 16B:
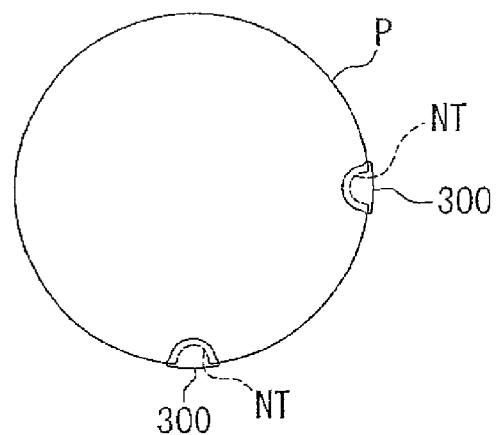

It should be noted that when, as shown in FIG. 16B, notch portion (cut portion) NT is formed in each of multiple positions of substrate P, it may be configured such that each of the multiple notch portions NT is covered with covering member 300. Furthermore, when notch portion NT is formed in each of multiple positions of substrate P, it may be configured, instead of covering such notch portions with covering members 300, such that multiple protrusion portions 150 are provided on plate portion 30 (substrate stage PST) in accordance with the multiple notch portions NT. By adopting such configurations, penetration of liquid 1 between plate portion 30 and substrate P (cut portion) can also be prevented.

Figure 17:
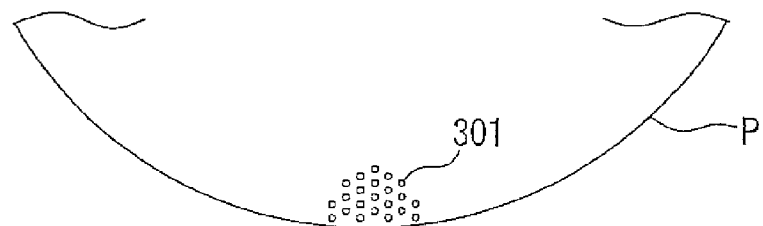
FIG. 17 is a drawing respectively showing an embodiment of a substrate related to an exposure method of the present invention.

Also, by providing a hole portion in a predetermined position of substrate P, instead of forming the cut portion on substrate P, substrate P can be pre-aligned by optically detecting the hole portion. In this case, the hole portion may be a through-hole having a small diameter sufficient not to allow liquid 1 to pass through the hole or may a dimple-shaped hole (concave portion) that does not pierce through substrate P. In FIG. 17 is shown an embodiment where a group of multiple small through-holes 301 having a diameter of, e.g., about 0.5 mm is formed in a predetermined position of substrate P.

Figure 18:
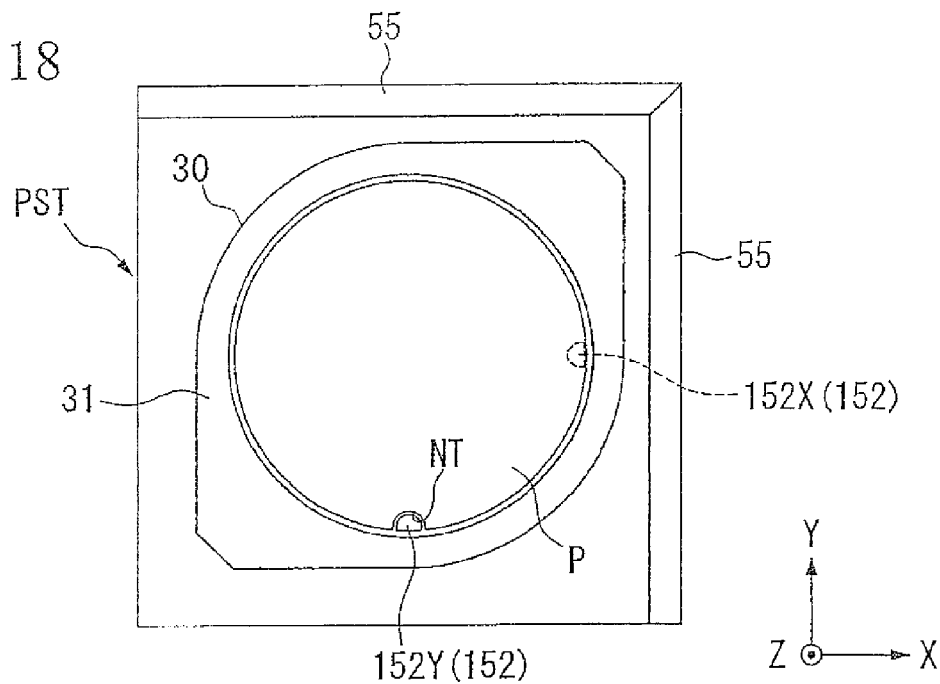
FIG. 18 is a plan view of a substrate stage related to another embodiment of the present invention.

FIG. 18 is a plan view illustrating another embodiment of the present invention. Note that the same members as those of FIG. 4 are denoted by the same reference numerals, and detailed descriptions thereof are omitted. In FIG. 18, each of protrusion members 152, as a gap adjustment portion, is provided in each of the multiple positions in the vicinity of the edge of substrate P supported by supporting portions 34. In the embodiment shown in FIG. 18, first protrusion member 152Y is provided in the vicinity of the −Y side edge of substrate P; second protrusion member 152X is provided in the vicinity of the +X side edge of substrate P. Each of protrusion members 152Y and 152X is provided movably in the Z-axis direction (in the vertical direction). In addition, a single cut portion (notch portion NT) is formed in the vicinity of the −Y side edge of substrate P.

Figure 19A:
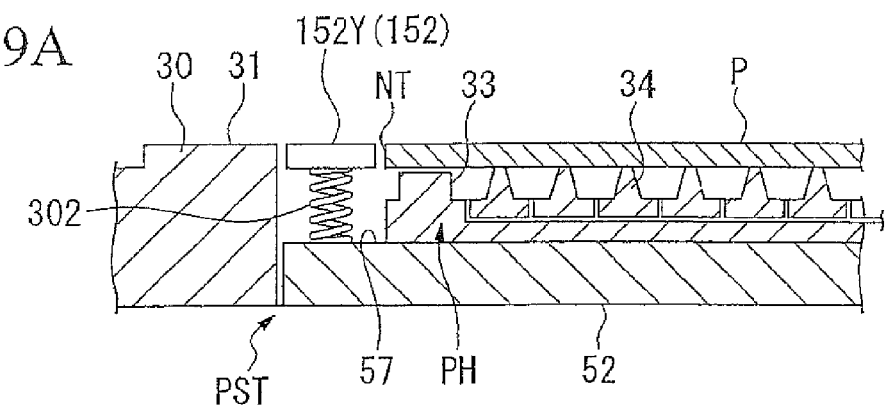
FIGS. 19A and 19B are cross sectional views respectively showing a main part of a substrate stage related to another embodiment of the present invention.
Figure 19B:
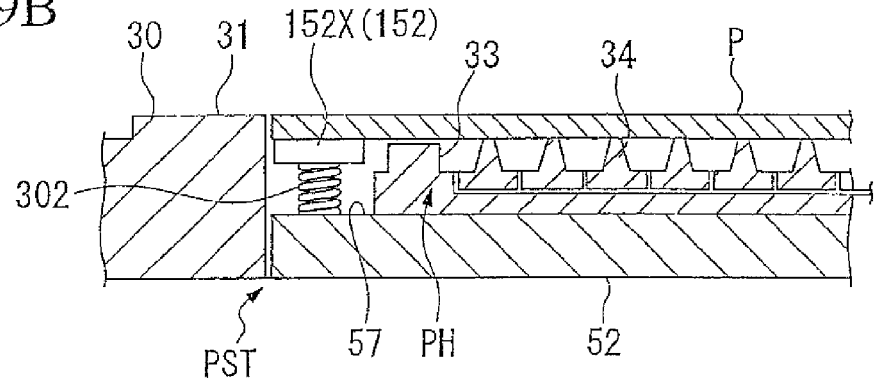

FIG. 19A is a cross sectional view illustrating first protrusion member 152Y and its vicinity; FIG. 19B is a cross sectional view illustrating second protrusion member 152X and its vicinity. As shown in FIGS. 19A and 19B, protrusion members 152 (152Y and 152X) are supported by elastic member 302. In the embodiment shown in FIGS. 19A and 19B, elastic member 302 is constituted by a coil spring member, and protrusion members 152 are supported, via the coil spring member, by the top surface (contact surface) 57 of Z stage 52. In a state in which notch portion NT, of substrate P, directed to the −Y side and protrusion member 152Y are aligned with each other, protrusion member 152Y is disposed, as shown in FIG. 19A, inside notch portion NT by the upward biasing force of coil spring member 302 without being pressed by substrate P. By virtue of protrusion member 152Y, the gap between notch portion NT of substrate P supported by supporting portions 34 and flat surface 31 of plate portion 30 can be made to be small. On the other hand, as shown in FIG. 19B, protrusion member 152X disposed in the position where notch portion does not exist is pressed from above by substrate P, and coil spring member 302 shortens. Thus, protrusion member 152X is disposed under substrate P. In contrast, when substrate P is supported by supporting portions 34 in a state in which notch NT is directed to the +X side, protrusion member 152X is disposed inside notch portion NT, and protrusion member 152Y is disposed under substrate P.

By adopting the configuration just described, the gap between notch portion NT of substrate P supported by supporting portions 34 and flat surface 31 of plate portion 30 can be made to be small. Furthermore, by applying, for example, with liquid-repellent treatment on the top surface and side surface of protrusion members 152 to make them liquid-repellent, as with flat surface 31 and inner side surface 36 of plate portion 30, penetration of liquid 1 can be prevented more effectively.

Figure 20A:
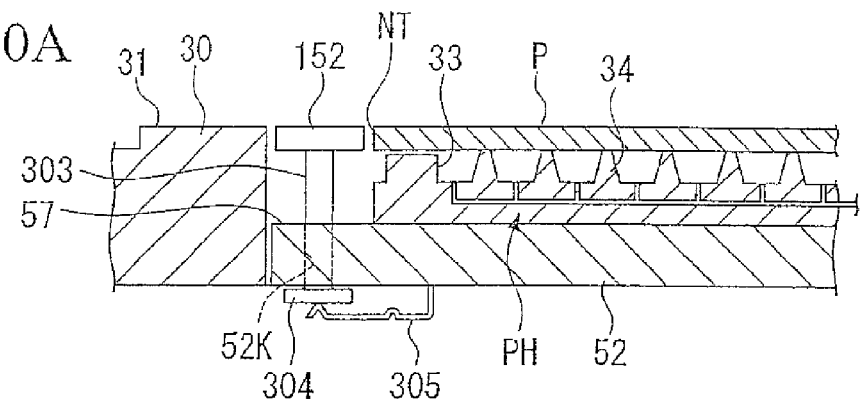
FIGS. 20A and 20B are cross sectional views respectively showing a main part of a substrate stage related to another embodiment of the present invention.
Figure 20B:
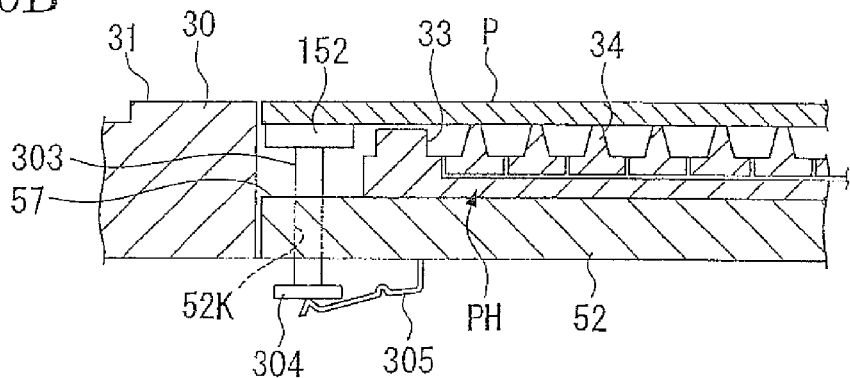

FIGS. 20A and 20B are cross sectional views illustrating another embodiment of the present invention. The embodiment of FIGS. 20A and 20B is a modification of the embodiment of FIGS. 19A and 19B, and the same members of the former as those of the latter are denoted by the same reference numerals. In FIG. 20, the under surface of protrusion member 152 is connected to the top end portion of the rod-shaped supporting member 303. In a portion of Z stage 52 is provided through-hole 52K, and supporting member 303 is disposed, inside through-hole 52K, movably in the Z-direction. The lower end portion of supporting member 303 protrudes from the under surface of Z stage 52, and the lower end portion of supporting member 303 is connected to collar member 304. Furthermore, leaf spring member 305 attached to the under surface of Z stage 52 is in contact with the under surface of collar member 304. As with the embodiment of FIGS. 19A and 19B, in a state in which notch portion NT of substrate P and protrusion member 152 are aligned with each other, protrusion member 152 is lifted upward by the biasing force of leaf spring member 305 and is disposed inside notch portion NT, as shown in FIG. 20A. On the other hand, in a state in which notch portion NT of substrate P and protrusion member 152 are not aligned with each other, protrusion member 152 is pressed by substrate P and is disposed under substrate P, as shown in FIG. 20B. Also in this case, by making the top surface and side surface of protrusion member 152 liquid-repellent, penetration of liquid 1 can be prevented effectively.

Figure 21A:
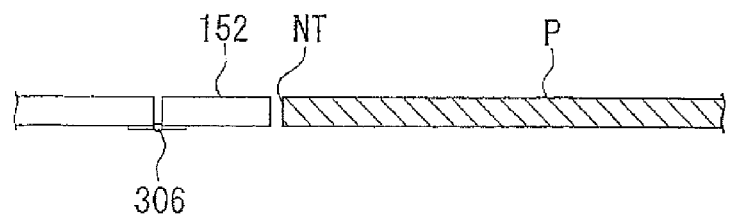
FIGS. 21A and 21B are drawings showing another embodiment of a gap adjustment portion related to the present invention.
Figure 21B:
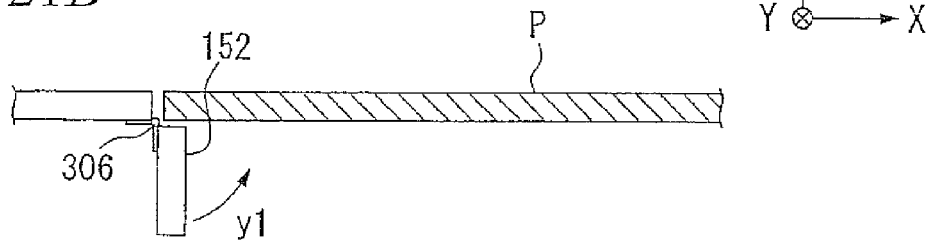

FIGS. 21A and 21B are cross sectional views illustrating another embodiment of the present invention. In FIGS. 21A and 21B, protrusion member 152 is connected, via hinge portion 306, to plate portion 30 (or a predetermined position of substrate stage PST). In FIGS. 21A and 21B, hinge portion 306 supports, rotatably in the θY-direction, protrusion member 152. Furthermore, hinge portion 306 has a spring member built-in and supports protrusion member 152 so as to bias it in the direction of y1 arrow in FIG. 21B. In other words, hinge portion 306 exerts a biasing force upon protrusion member 152 in the direction such that the top surface of protrusion member 152 and the surface of substrate P constitute a single plane. It is to be noted that hinge portion 306 has a stopper, and the rotation of protrusion member 152 is stopped when the top surface of protrusion member 152 and the surface of substrate P substantially constitute a single plane. Thus, in a state in which notch portion NT of substrate P and protrusion member 152 are aligned with each other, protrusion member 152 is disposed inside notch portion NT, as shown in FIG. 21A. On the other hand, in a state in which notch portion NT of substrate P and protrusion member 152 are not aligned with each other, protrusion member 152 is pressed by substrate P and is disposed under substrate P, as shown in FIG. 21B. Also in this case, by making the top surface and side surface of protrusion member 152 liquid-repellent, penetration of liquid 1 can be prevented effectively.

It should be noted that while, in the above-described embodiments, it is configured such that protrusion members 152 is moved by a spring member, it may also be configured such that protrusion member 152 is moved by using a predetermined actuator. In this case, for example, before substrate P is mounted on substrate stage PST, the position information of notch portion NT is obtained. Furthermore, after substrate P is mounted on substrate stage PST, a specified protrusion member 152 among the multiple protrusion members 152 provided on substrate stage PST is driven, based on the obtained position information, by using the actuator to dispose the specified protrusion member 152 inside notch portion NT. Furthermore, it may also be configured such that protrusion member 152 is detachably provided on substrate stage PST, and an operator, for example, manually disposes protrusion member 152 inside notch portion NT of substrate P on substrate stage PST, without using an actuator. Still further, it may also be configured such that a robot arm that can hold protrusion member 152 detachable relative to substrate stage PST disposes protrusion member 152 inside notch portion NT of substrate P on substrate stage PST.

Figure 22:
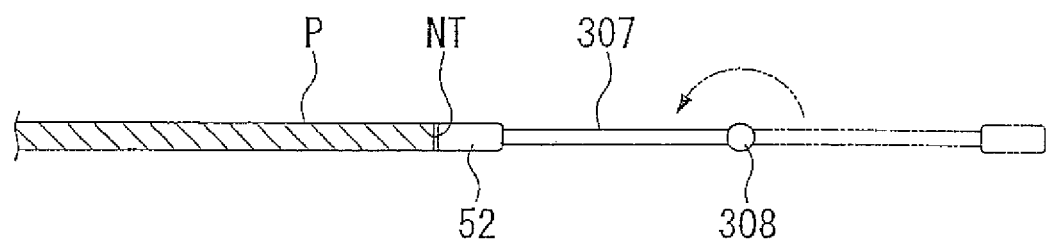
FIG. 22 is a drawing showing another embodiment of a gap adjustment portion related to the present invention.

FIG. 22 illustrates an embodiment in which protrusion member 152 is disposed inside notch portion NT by using an actuator. In FIG. 22, protrusion member 152 is attached to one end portion (edge portion) of the rod-shaped supporting member 307, and the other end portion (base portion) of supporting member 307 is connected to actuator 308. Actuator 308 can rotate supporting member 307, to which protrusion member 152 is attached, with the base portion of supporting member 307 being the rotation center. In FIG. 22, actuator 308 rotates supporting member 307 in the θY-direction. By rotating supporting member 307, actuator 308 can dispose protrusion member 152 attached to the edge portion of supporting member 307 inside notch portion NT. Also in this case, by making the top surface and side surface of protrusion member 152 liquid-repellent, penetration of liquid 1 can be prevented effectively. Furthermore, after a liquid immersion exposure is performed, actuator 308 can, by rotating supporting member 307 in the reverse direction, remove protrusion member 152 from notch portion NT of substrate P.

Figure 23:
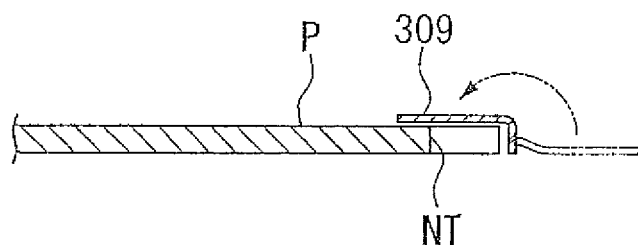
FIG. 23 is a drawing showing another embodiment of a gap adjustment portion related to the present invention.

Also, by covering notch portion NT with sheet member 309 as shown in FIG. 23, penetration of liquid 1 between notch portion NT and plate portion 30 (flat surface 31) can be suppressed. Sheet member 309 is preferably liquid-repellent; and, for example, a sheet member made of polytetrafluoroethylene (TEFLON (registered trademark)) can be used as sheet member 309.

In addition, it may be configured such that sheet member 309 is formed to be annular-shaped, and such sheet member 309 covers the entirety of the gap between substrate P and flat surface 31.

Furthermore, in each of the above-described embodiments, protrusion member 152 is preferably replaceable. While protrusion member 152 is preferably liquid-repellent, the liquid-repellency may deteriorate with time. Thus, by replacing protrusion member 152 when its liquid-repellency has deteriorated, penetration of liquid 1 can be prevented effectively by using another protrusion member 152 having desired liquid-repellency.

Furthermore, although, in each of the above-described embodiments, the configuration in which protrusion member 152 is disposed in notch portion NT was described by way of illustration, such configuration can also, of course, be applied to a flat member corresponding to "orifla" portion OF formed on substrate P. In this case, by using an elastic member (spring member), the flat member is disposed in a predetermined position; the gap between "orifla" portion OF of substrate P supported by supporting portions 34 and flat surface 31 of plate portion 30 is made to be small; and thus, penetration of liquid 1 can be prevented.

Furthermore, needless to say, the embodiments described with reference to FIGS. 1 to 8 and their modifications may be appropriately combined with the embodiments described with reference to FIGS. 9 to 23 and their modifications.

Figure 24:
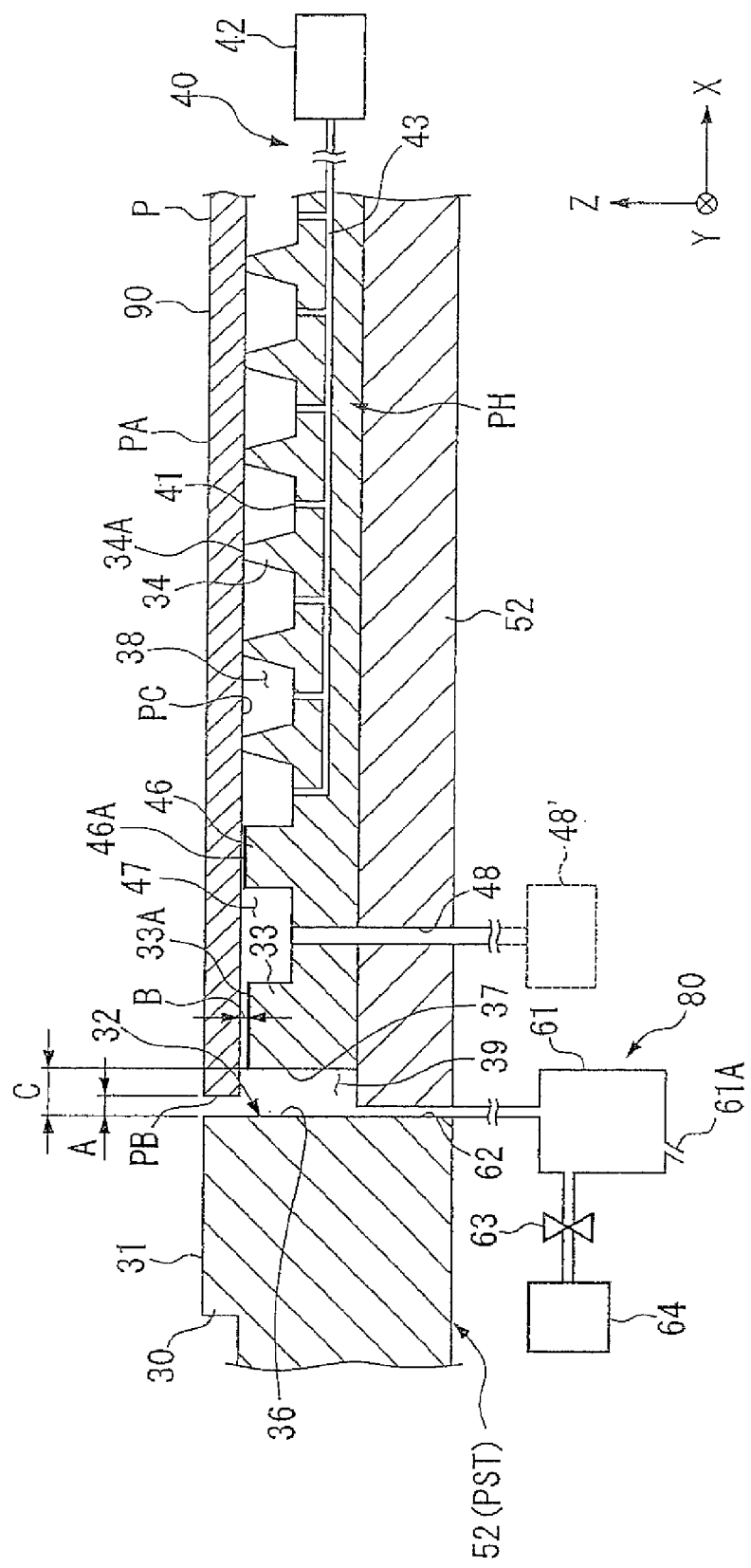
FIG. 24 is a cross sectional view showing a main part of a substrate stage related to another embodiment of the present invention.

FIG. 24 is a cross sectional view showing another embodiment of the present invention. Note that description of the same members as those of FIGS. 4, 6, and 8 is omitted. In FIG. 24, substrate stage PST is provided with peripheral wall 33, second peripheral wall 46 formed inside peripheral wall 33, and supporting portions 34 formed inside second peripheral wall 46. Suction device 40 performs the suction operation, via suction ports 41, to apply a negative pressure to first space 38 surrounded by second peripheral wall 46, and thus substrate P is suck-and-held by supporting portions 34.

Furthermore, the pressure of buffer space 47 between peripheral wall 33 and second peripheral wall 46 is set to be higher than the pressure of first space 38 surrounded by second peripheral wall 46. More specifically, as with the embodiment described referring to FIG. 6, buffer space 47 is, via flow channel 48, open to the atmosphere, and the pressure of buffer space 47 is set to be substantially equal to the atmospheric pressure. Alternatively, by using gas supply device 48' have a pressure adjustment function, buffer space 47 may be set to have a pressure slightly higher than the atmospheric pressure, or may be set to have a pressure lower than the atmospheric pressure and higher than the pressure of first space 38 (i.e., low negative pressure).

The height of peripheral wall 33 is set to lower than that of supporting portions 34. The height of second peripheral wall 46 is also set to lower than that of supporting portions 34. Furthermore, top surface 33A of peripheral wall 33 is applied with liquid-repellent treatment to have liquid-repellency, and top surface 46A of second peripheral wall 46 is also applied with liquid-repellent treatment to have liquid-repellency.

It is to be noted that it may also be configured such that only one of the surfaces of top surface 33A of first peripheral wall 33 and top surface 46A of second peripheral wall 46 is made to be liquid-repellent.

In contrast to FIG. 6, in the embodiment, second space 39 between inner side surface 36 of concave portion 32 and side surface 37 of substrate holder PH is not filled with liquid 1. Furthermore, to second space 39 is connected second suction device 80 for adjusting the pressure of second space 39 and, at the same time, for recovering liquid 1 that has flowed, via gap A, into second space 39. Second suction device 80 has an configuration equivalent to the configuration described referring to FIG. 8 and can make the pressure of second space 39 lower than the pressure of buffer space 47. By this, even if liquid 1 penetrate slightly from gap A, penetration, of the liquid 1 having penetrated, into buffer space 47 through gap B between top surface 33A of first peripheral wall 33 and substrate P can be suppressed. In addition, second suction device 80 can recover the liquid that has penetrated into second space 39.

It is to be noted that it may also be configured such that, as shown in FIG. 4, only with tank 61 is provided, without pump 64 and valve 63 being provided. Still further, it may also be configured such that, as shown in FIG. 4, second space 39 is open to the atmosphere.

In this case, the pressure of buffer space 47 is set to be slightly higher than the atmospheric pressure by using gas supply device 48'. By this, even if liquid 1 penetrate slightly from gap A, penetration, of the liquid 1 having penetrated, into buffer space through gap B between top surface 33A of first peripheral wall 33 and substrate P can be suppressed. In addition, the liquid that has penetrated into second space 39 can be recovered.

When holding substrate P by and on supporting portions 34, first space 38 is made to have a negative pressure, and, at the same time, the pressure of buffer space 47 is made to be higher than that of first space 38. Preferably, the pressure of buffer space 47 is made to be substantially equal to the atmospheric pressure or to be higher than the atmospheric pressure. By this setting, even if liquid 1 has penetrated into second space 39 through gap A, since the pressure of buffer space 47 is set to be higher, the disadvantage that liquid 1 would penetrate, via buffer space 47, into first space 38 and furthermore to the underside surface of substrate P or into suction ports 41 is prevented. Furthermore, in the embodiment, even when the cut portion of substrate P is positioned on top surface 33A of peripheral wall 33, the disadvantage that liquid 1 that has penetrated between the cut portion and flat surface 31 would penetrate to the side of buffer space 47 or of first space 38 can be reduced.

Furthermore, while there is the possibility that the liquid flows beyond top surface 33A of peripheral wall 33 depending on the size of the cut portion of substrate P, since the liquid that has flowed beyond top surface 33A of peripheral wall 33 can be captured by buffer space 47, penetration of the liquid into first space 38 can be prevented. It is to be noted that preparing for such case, it may be configured such that the liquid that has penetrated into buffer space 47 is recovered.

In addition, although detailed description is omitted, it may be configured such that, as with the embodiment shown in FIG. 4, side surface PB of substrate P, underside surface PC of substrate P, flat surface 31 of plate portion 30, and/or inner side surface 36 of plate portion 30 are made to be liquid-repellent.

In other words, the liquid-repellent treatments of at least a part of each surface of substrate P, substrate holder PH, and substrate stage PST, as described in connection with the embodiment of FIG. 4 and its modifications, can be appropriately combined with the embodiment of FIG. 24.

It should be noted that since, in the embodiment of FIG. 24, the negative pressure of first space 38 can be maintained by second peripheral wall 46, a cut portion to communicate buffer space 47 and second space 39 with each other may be provided on a portion of first peripheral wall 33.

Figure 25A:
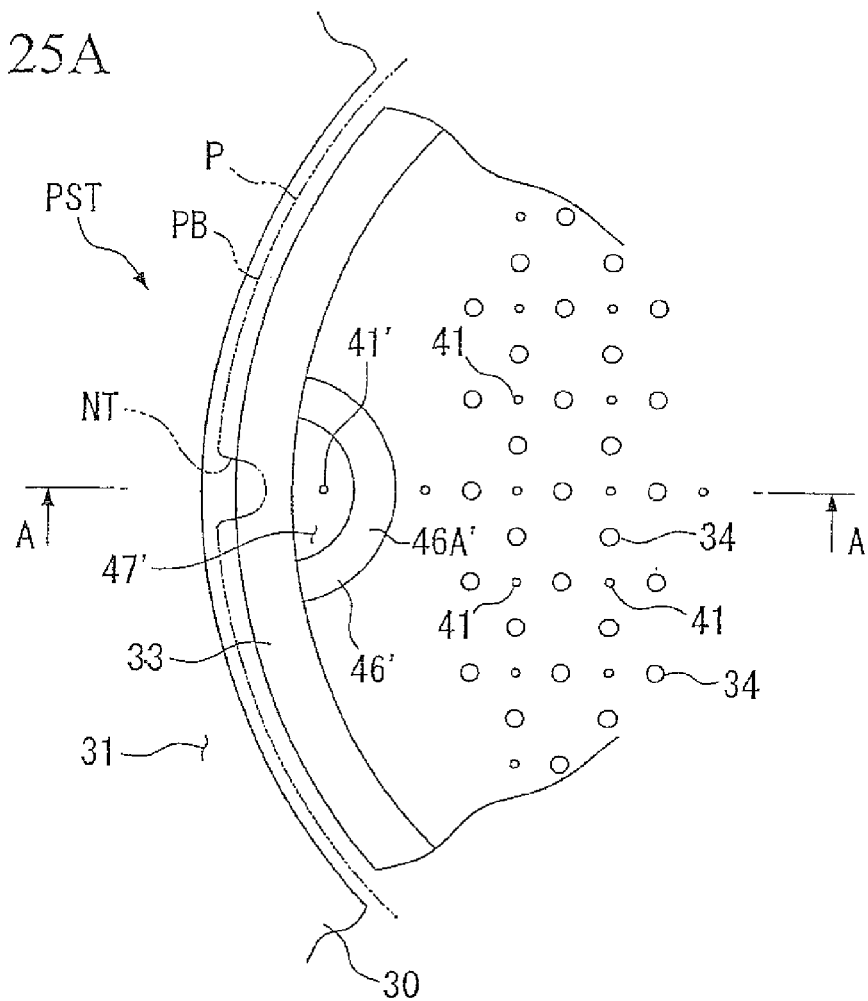
FIGS. 25A and 25B are drawings of a substrate stage related to another embodiment of the present invention.
Figure 25B:
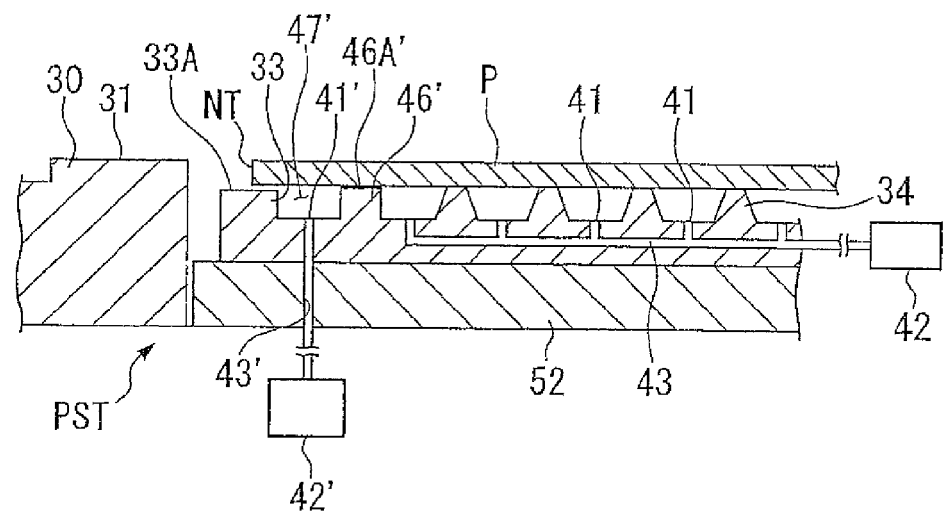

FIGS. 25A and 25B are drawings illustrating another embodiment of the present invention; FIG. 25A is a plan view; FIG. 25B is a cross-sectional view taken along the arrow A-A of FIG. 25A. Note that the same members as those of FIG. 3 are denoted by the same reference numerals, and detailed descriptions thereof are omitted. In FIGS. 25A and 25B, substrate stage PST is provided with a plurality of suction ports (air suction ports) 41 for suck-and-holding substrate P on supporting portions 34. Furthermore, on an inside portion of peripheral wall 33 is locally formed second peripheral wall 46'.

As shown in FIG. 25A, second peripheral wall 46' is provided in a position corresponding to notch portion NT (or orifla portion) of substrate P supported by supporting portions 34. Second peripheral wall 46' has top surface 46A' that is substantially arc-shaped as viewed from the top, and both ends of the peripheral wall are connected to peripheral wall 33. Furthermore, between peripheral wall 33 and second peripheral wall 46' is formed buffer space 47'. Buffer space 47 is formed in the vicinity of notch portion NT of substrate P supported by supporting portions 34. In the embodiment also, each of the heights of peripheral wall 33 and second peripheral wall 46' is set to be lower than the height of supporting portions 34, the top surfaces of peripheral wall 33 and second peripheral wall 46' have liquid-repellency.

The plurality of suction ports 41 provided in first space 38 are connected, via flow channel 43, to vacuum portion (vacuum system) 42. On the other hand, suction ports 41' provided in buffer space 47' located in the vicinity of notch portion NT of substrate P are connected, via second flow channel 43', to second vacuum portion (second vacuum system) 42' provided separately from vacuum portion 42. The suction force (per-unit-time gas suction amount) of second vacuum portion 42' is set to be weaker than that of vacuum portion 42. In other words, regarding the multiple suction ports provided on substrate stage PST, the suction force via suction ports 41' located in the vicinity of notch portion NT of substrate P is set to be smaller than the suction force via suction ports 41 surrounding suction ports 41'.

Since, in this way, the suction force via suction ports 41' located in the vicinity of notch portion NT of substrate P is made to be smaller than the suction force via the other suction ports 41, even when it is configured such that the gap between notch portion NT of substrate P and flat surface 31 (plate portion 30) is larger than the gap between side surface PB, other than the side surface of notch portion NT, of substrate P and flat surface 31, and thus liquid 1 is likely to penetrate, the disadvantage that liquid 1 would penetrate between notch portion NT and flat surface 31 can be suppressed.

Furthermore, even if the liquid has penetrated to the underside surface side of substrate P, with the liquid flowing through notch portion NT of substrate P and then flowing beyond top surface 33A of peripheral wall 33, since the liquid can be captured by buffer space 47', penetration of the liquid into first space 38 can be blocked. It is to be noted that preparing for such case, it may be configured such that the liquid that has penetrated into buffer space 47' is recovered.

It should be noted that it may also be configured such that without separating the vacuum system connected to suction ports 41' from the vacuum system connected to the other suction ports 41, the suction force in the vicinity of notch portion NT of substrate P is made to be smaller. For example, it may be configured such that the bore diameter of suction ports 41' in the vicinity of notch portion NT of substrate P is made to be smaller than that of the other suction ports 41. Also, it may be configured such that, regarding the multiple suction ports, the layout density of suction ports in the vicinity of notch portion NT is made to be smaller than that of the other suction ports surrounding the suction ports in the vicinity of notch portion NT.

Alternatively, it may be configured such that no suction ports are provided in the vicinity of notch portion NT of substrate P. Still further, it may be configured such that by, for example, closing flow channel 43' connected to suction ports 41' by using, for example, a valve, gas-suction is not performed through the suction ports provided in the vicinity of notch portion NT of substrate P.

It should be noted that when by making the suction force in the vicinity of cut portion (notch portion) NT of substrate P smaller, penetration of the liquid to the underside surface side of substrate P, it may be configured such that second peripheral wall 46' is not formed.

Needless to say, also in the embodiment of FIGS. 25A and 25B, it may be configured such that, as with the embodiment shown in FIG. 4, side surface PB of substrate P, underside surface PC of substrate P, flat surface 31 of plate portion 30, and/or inner side surface 36 of plate portion 30 are made to be liquid-repellent.

In the above-described embodiments, when the pressure of the liquid forming immersion region AR2 is high, the possibility that the liquid may penetrate through gaps existing on substrate stage PST (e.g., the gap around substrate P) increases; and thus, to address this issue, it may also be configured such that when immersion region AR2 is formed on such gaps on substrate stage PST, the pressure of the liquid is lowered. In particular, since there is the possibility that the pressure of the liquid may be high underneath supply ports 13A and 14A of liquid supply system 10, by making the pressure of the liquid smaller when supply ports 13A and 14A of liquid supply system 10 face the gaps on substrate stage PST, penetration of the liquid through the gaps can be suppressed.

Furthermore, needless to say, the embodiments described with reference to FIGS. 24 and 25 may be appropriately combined with the embodiments described with reference to FIGS. 9 to 23.

In each of the above-described embodiments, liquid 1 is constituted by purified water. Purified water has the advantage that it is easily available in bulk in, e.g., semiconductor manufacturing factories and also the advantage that it does not adversely affect photoresist on substrate P, optical elements (lenses), etc. Furthermore, purified water does not adversely affect the environment and contains scarcely any impurities; thus, the effect that it cleans the surface of substrate P and the surface of the optical element provided at the end portion of projection optical system PL can be expected. It should be noted that when the purity of the purified water supplied from, e.g., the factory is low, it may be configured such that the exposure apparatus itself has an ultra-purified water producing system.

The refractive index n of purified water (water) relative to exposure light EL having a wavelength of about 193 nm is said to be approximately 1.44, and when ArF excimer laser light (having 193 nm wavelength) is used as the light source of exposure light EL, the wavelength is effectively shortened, on substrate P, as if multiplied by 1/n, i.e., effectively becomes approximately 134 nm, and thus, a high resolution can be obtained. Furthermore, since the depth of focus increases by approximately n times, i.e., approximately by 1.44 times, compared with that in the air, when securing of the depth of focus on par with the depth of focus realized when the projection optical system is used in the air suffices, the numerical aperture of the projection optical system PL can be further increased; which also improves the resolution.

When the liquid immersion method is used as described above, the numerical aperture NA of the projection optical system may become 0.9 to 1.3. When, in this manner, the numerical aperture NA of the projection optical system becomes large, random-polarized light conventionally used as the exposure light may, because of its polarization effect, adversely affect the imaging performance; thus, a polarized light illumination method is preferably used. In this case, it is preferable that by performing linearly polarized light illumination in which the longitudinal direction of the line pattern of the line-and-space pattern on the mask (reticle) is aligned with the polarization direction, a lot of diffraction lights from S polarization components (TE polarization components), i.e., the diffraction lights from the polarization components having the polarization direction in line with the longitudinal direction of the line pattern are emitted from the pattern of the mask (reticle). When the space between projection optical system PL and the resist applied to the surface of substrate P is filled with the liquid, the transmittance at the resist surface of the diffraction lights from S polarization components (TE polarization components), which contribute to the improvement of the contrast, is higher compared with the case where the space between projection optical system PL and the resist applied to the surface of substrate P is filled with the gas (air), a high imaging performance can be obtained even in the case where the numerical aperture NA of the projection optical system is over 1.0. Furthermore, a phase shift mask, an oblique incidence illumination method (in particular, the dipole illumination method), as disclosed in Japanese Unexamined Patent Application, First Publication No. H06-188169, which meets the longitudinal direction of the line pattern, etc. may be appropriately combined with the above configuration, which works more effectively.

It should be noted that, for example, when by using, for example, ArF excimer laser light as the exposure light and using projection optical system PL having a reduction magnification of about ¼, a fine line-and-space pattern (e.g., line-and-space of about 25 to 50 nm) is exposed onto substrate P, depending on the structure of mask M (e.g., the fineness of the pattern or the thickness of chrome), mask M acts as a polarization plate due to the wave guide effect, and the emitted amount of the diffraction lights from S polarization components (TE polarization components) becomes larger than the emitted amount of the diffraction lights from P polarization components (TM polarization components), which lower the contrast, and thus, even when mask M is illuminated with random-polarized light, a high resolution performance can be obtained even in the case where the numerical aperture NA of the projection optical system PL is 0.9 to 1.3, although the above-described linearly polarized light illumination is preferably employed. Furthermore, although, for example, when a very fine line-and-space pattern on mask M is exposed onto substrate P, there is the possibility that the emitted amount of the diffraction lights from P polarization components (TM polarization components) becomes larger than the emitted amount of the diffraction lights from S polarization components (TE polarization components) due to the wire grid effect, since, for example, when by using, for example, ArF excimer laser light as the exposure light and using projection optical system PL having a reduction magnification of about ¼, a line-and-space pattern of more than 25 nm is exposed onto substrate P, the emitted amount of the diffraction lights from S polarization components (TE polarization components) is larger than the emitted amount of the diffraction lights from P polarization components (TM polarization components), a high resolution performance can be obtained even in the case where the numerical aperture NA of the projection optical system is 0.9 to 1.3.

Furthermore, not only the linearly polarized light illumination in which the longitudinal direction of the line pattern on the mask (reticle) is aligned with the polarization direction, but also the combination, as disclosed in Japanese Unexamined Patent Application, First Publication No. H06-53120, of the polarized light illumination method, in which the lights used are linearly polarized in the tangential directions relative to a circle, of which center is the optical axis, and an oblique incidence illumination method is effective. In particular, in the case where the pattern of the mask (reticle) includes not only line patterns which extend in a predetermined single direction but also line patterns which extends in multiple different directions, by using, as also disclosed in Japanese Unexamined Patent Application, First Publication No. H06-53120, the polarized light illumination method, in which the lights used are linearly polarized in the tangential directions relative to a circle, of which center is the optical axis, in combination with an annular illumination method, a high resolution performance can be obtained even in the case where the numerical aperture NA of the projection optical system is large.

In the embodiments, optical element 2 is attached to the end of projection optical system PL, and by this lens, the optical characteristics of projection optical system PL (spherical aberration, coma aberration, etc.) can be adjusted. It should be noted that as the optical element to be attached to the end of projection optical system PL, an optical plate used for the adjustment of the optical characteristics of projection optical system PL may be utilized. Alternatively, a plane parallel plate that can transmit exposure light EL may be utilized.

It should be noted that if the pressure, caused by the flow of liquid 1, of the space between the optical element located at the end of projection optical system PL and substrate P is high, it may be configured such that the optical element is rigidly fixed so as not to move due to the pressure, instead of making the optical element replaceable.

It should be noted that while, in the embodiments, it is configured such that the space between projection optical system PL and the surface of substrate P is filled with liquid 1, it may also be configured, for example, such that the space is filled with liquid 1 in the condition that a cover glass constituted by a plane parallel plate is attached to the surface of substrate P.

It should be noted that while, in the embodiments, liquid 1 is water, liquid 1 may be a liquid other than water. For example, when the light source of exposure light EL is an $F_2$ laser, the $F_2$ laser light does not transmit through water, and thus, as liquid 1, a fluorofluid that can transmit the $F_2$ laser light, such as perfluoropolyether (PFPE) or fluorochemical oil, may be used. Furthermore, as liquid 1, a material (e.g., cedar oil) that can transmit exposure light EL, has a high refractive index as high as practicable, and does not affect projection optical system and the photoresist applied to the surface of substrate P can also be used. Also in this case, the surface treatment is applied in accordance with the polarity of liquid 1.

It is to noted that regarding substrate P of each of the above-described embodiments, not only a semiconductor wafer for manufacturing a semiconductor device, but also a glass substrate for a display device, a ceramic wafer for a thin film magnetic head, a master mask or reticle (synthetic quartz or silicon wafer), etc. can be used.

Regarding exposure apparatus EX, in addition to a scan type exposure apparatus (scanning stepper) in which while synchronously moving mask M and substrate P, the pattern of mask M is scan-exposed, a step-and-repeat type projection exposure apparatus (stepper) in which the pattern of mask M is exposed at one time in the condition that mask M and substrate P are stationary, and substrate P is successively moved stepwise can be used. Also, the present invention can be applied to a step-and-stitch type exposure apparatus in which at least two patterns are transferred onto substrate P in a partially overlapping manner.

Furthermore, the present invention can be applied to a stitch type one-shot exposure apparatus in which in the state that a first pattern and substrate P are substantially stationary, the reduction image of the first pattern is exposed at one time by using a projection optical system (e.g., a refraction type projection optical system that has a reduction magnification of ⅛ and includes no reflecting element), and thereafter, in the state that a second pattern and substrate P are substantially stationary, the reduction image of the second pattern is exposed at one time onto substrate P by using the projection optical system in a manner that the first pattern image and the second pattern image partially overlap with each other.

Also, the present invention can be applied to a twin stage type exposure apparatus, which is disclosed in, e.g., Japanese Unexamined Patent Application, First Publication No. H10-163099, Japanese Unexamined Patent Application, First Publication No. H10-214783, and Published Japanese Translation No. 2000-505958.

Regarding the type of exposure apparatus EX, the present invention is not limited to an exposure apparatus, which exposes a semiconductor pattern onto substrate P, for manufacturing semiconductor devices, but can also be applied to a variety of exposure apparatuses, e.g., an exposure apparatus for manufacturing liquid crystal display devices or a displays, an exposure apparatus for manufacturing thin film magnetic heads, an exposure apparatus for manufacturing image pickup devices, and an exposure apparatus for manufacturing reticles or masks.

When using a linear motor (see U.S. Pat. No. 5,623,853 or U.S. Pat. No. 5,528,118) in substrate stage PST or mask stage MST, either air-cushion type linear motor using an air bearing or a magnetic levitation type linear motor using a Lorentz force or reactance force may be used. Furthermore, each of substrate stage PST and mask stage MST may be either of a type moving along a guide or of a guideless type having no guide.

As the driving mechanism for each of substrate stage PST and mask stage MST, a planar motor in which by making a magnet unit in which magnets are two-dimensionally arranged and an armature unit in which coils are two-dimensionally arranged face each other, each of substrate stage PST and mask stage MST is driven by an electromagnetic force may be used. In this case, either one of the magnet unit and the armature unit is attached to stage PST or stage MST, and the other unit is attached to the moving surface side of stage PST or stage MST.

A reaction force generated by the movement of substrate stage PST may be, as described in Japanese Unexamined Patent Application, First Publication No. H08-166475 (U.S. Pat. No. 5,528,118), mechanically released to the floor (earth) by use of a frame member so that the force does not transmit to projection optical system PL.

A reaction force generated by the movement of mask stage MST may be, as described in Japanese Unexamined Patent Application, First Publication No. H08-330224 (U.S. Pat. No. 5,874,820), mechanically released to the floor (earth) by use of a frame member so that the force does not transmit to projection optical system PL.

Exposure apparatus EX according to the embodiments of the present application is built by assembling various subsystems, including each element listed in the claims of the present application, in such a manner that prescribed mechanical accuracy, electrical accuracy, and optical accuracy are maintained. In order to ensure the various accuracies, prior to and after the assembly, every optical system is adjusted to achieve its optical accuracy, every mechanical system is adjusted to achieve its mechanical accuracy, and every electrical system is adjusted to achieve its electrical accuracy. The process of assembling each subsystem into the exposure apparatus includes mechanical interfaces, electrical circuit wiring connections, and air pressure plumbing connections between each subsystem. Needless to say, there is also a process where each subsystem is assembled prior to the assembling of the exposure apparatus from the various subsystems. On completion of the process of assembling the various subsystems in the exposure apparatus, overall adjustment is performed to make sure that every accuracy is maintained in the complete exposure apparatus. Additionally, it is desirable to manufacture the exposure apparatus in a clean room, in which the temperature, purity, etc. are controlled.

Figure 26:
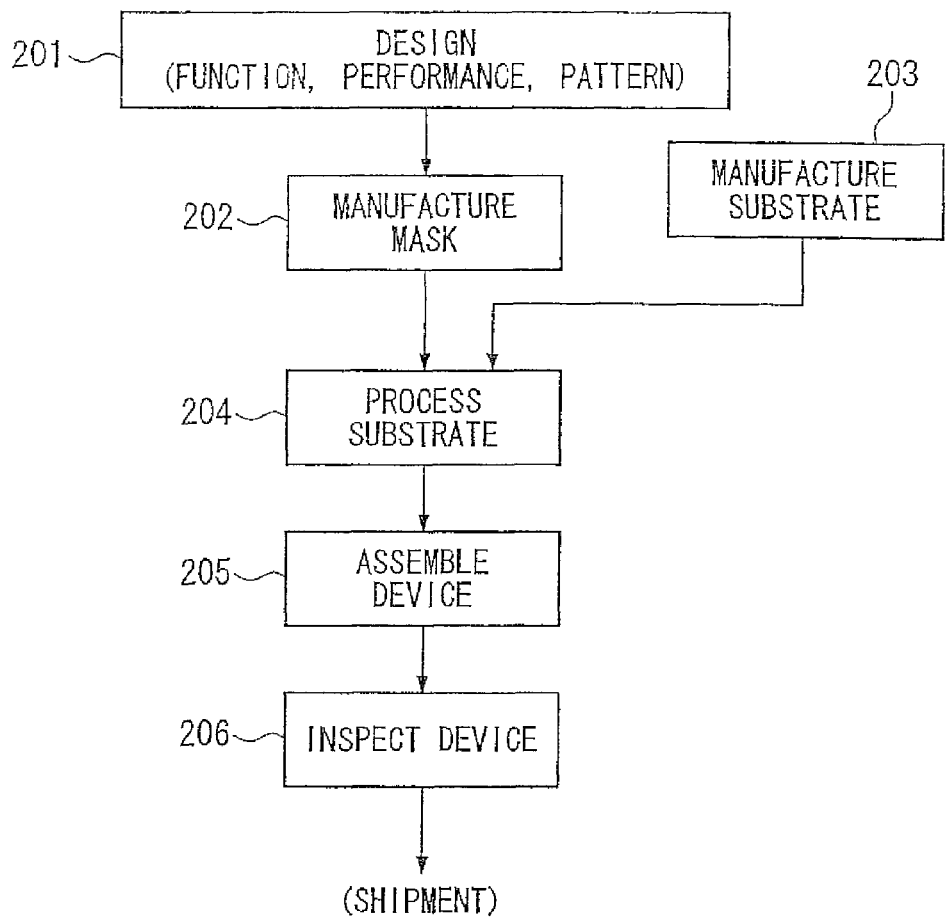
FIG. 26 is a flowchart showing an example of a semiconductor device manufacturing process.
Figure 27:
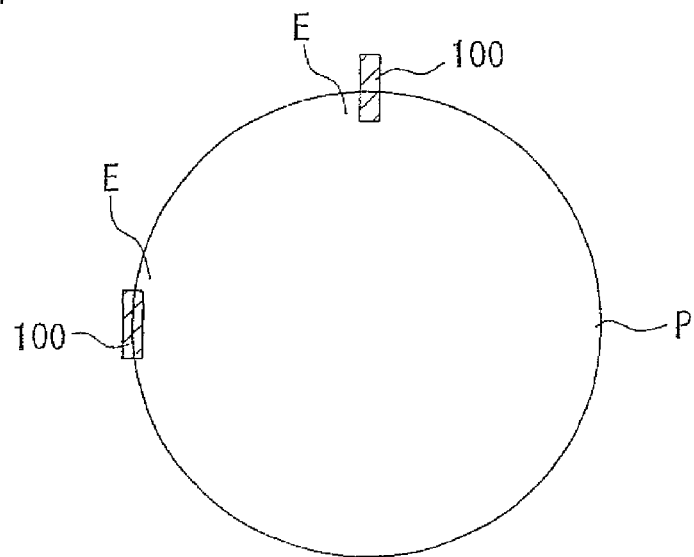
FIG. 27 is a schematic for explaining problems of a prior art exposure method.

As shown in FIG. 26, micro devices such as semiconductor devices are manufactured by a series of steps, including: step 201 in which the micro device's function and performance design is performed; step 202 in which a mask (reticle) is manufactured based on the design step; step 203 in which a substrate, the device's base material, is manufactured; step 204 in which the mask pattern is exposed onto the substrate by exposure apparatus EX according to the above-described embodiments; device assembly step 205 (including the dicing process, bonding process, and packaging process); inspection step 206.

In accordance with the present invention, even when exposing edge areas of a substrate, the exposure can be performed in a condition that a liquid immersion region is formed well and that penetration of the liquid and flowing out of the liquid to the outside of a substrate stage are prevented, and devices having a desired performance can be manufactured.

What is claimed is:

1. An exposure apparatus which exposes a substrate to light passing through a projection optical system and liquid, the exposure apparatus comprising:
    a stage which holds the substrate by a substrate holder disposed in a recess of the stage and moves relative to the projection optical system; and
    a mark arranged on the stage to align the substrate held by the substrate holder, wherein:
    the stage includes a portion in a top surface of the stage around the recess, the portion being formed so as to keep liquid on the top surface of the stage being in motion relative to the projection optical system and being provided at least between the mark and the recess,
    the substrate holder holds the substrate such that a height of a surface of the substrate is substantially equal to a height of the portion, and
    all surfaces of the stage and the substrate holder are lower than a lowermost surface of the projection optical system.

2. The exposure apparatus according to claim 1, wherein the stage comprises a flow channel connected to an internal space of the recess to remove liquid from the internal space.

3. The exposure apparatus according to claim 2, wherein the flow channel is connected to a space between an inner side surface of the recess and an outer side surface of the substrate holder.

4. The exposure apparatus according to claim 1, comprising:
    a liquid supply system having a supply port to supply the liquid; and
    a liquid recovery system having a recovery port to recover the liquid supplied from the supply port,
    wherein the supply port and the recovery port are disposed above the stage.

5. The exposure apparatus according to claim 4, wherein the supply port is provided to face the surface of the substrate held by the substrate holder.

6. The exposure apparatus according to claim 5, wherein the recovery port is disposed outwardly relative to the supply port in a predetermined direction with respect to an optical axis of the projection optical system, the predetermined direction being perpendicular to the optical axis.

7. The exposure apparatus according to claim 6, wherein the recovery port is arranged on each side of the optical axis in the predetermined direction.

8. The exposure apparatus according to claim 6, wherein the predetermined direction is a scanning direction of the stage in which the stage is moved to scan-expose the substrate on the stage to the light passing through the projection optical system and the liquid.

9. The exposure apparatus according to claim 1, wherein the substrate holder comprises at least one peripheral wall and a supporting portion disposed in a space surrounded by the at least one peripheral wall, and holds the substrate on the supporting portion by applying a negative pressure to the space surrounded by the at least one peripheral wall.

10. The exposure apparatus according to claim 9, wherein the at least one peripheral wall comprises a first peripheral wall and a second peripheral wall, the second peripheral wall being provided around the supporting portion and surrounded by the first peripheral wall.

11. The exposure apparatus according to claim 10, wherein the substrate holder comprises a gas flow channel connected to the space surrounded by the second peripheral wall to apply the negative pressure to the space via the gas flow channel.

12. The exposure apparatus according to claim 9, wherein a height of an upper surface of the at least one peripheral wall is lower than a height of an upper surface of the supporting portion.

13. The exposure apparatus according to claim 1, wherein the projection optical system comprises an optical element that is disposed to contact with the liquid and made of quartz or fluorite.

14. The exposure apparatus according to claim 1, wherein at least a part of the stage is liquid-repellent.

15. An exposure method which exposes a substrate to light passing through a projection optical system and liquid, the exposure method comprising:
    exposing the substrate by use of the exposure apparatus according to claim 1.

16. The exposure method according to claim 15, wherein the method comprises filling an optical path of the light between the projection optical system and the substrate on the stage with liquid.

17. A device manufacturing method comprising:
    transferring a pattern image onto a substrate by exposing the substrate with the exposure apparatus according to claim 1; and
    assembling a device on the substrate onto which the pattern image is transferred.

* * * * *